United States Patent
Laut et al.

(10) Patent No.: US 11,033,018 B2
(45) Date of Patent: Jun. 15, 2021

(54) SENSOR FOR A WIRELESS ANIMAL TRAP DETECTION SYSTEM

(71) Applicants: Bayer CropScience LP, St. Louis, MO (US); BAYER CROPSCIENCE AKTIENGESELLSCHAFT, Monheim am Rhein (DE)

(72) Inventors: Mike Laut, Raleigh, NC (US); Steven Bockmann, Durham, NC (US); Gaelle Fages, Chapel Hill, NC (US); Byron Reid, Raleigh, NC (US); Chris Pienaar, Chapel Hill, NC (US); Peter Jardine, Wake Forest, NC (US); Michael Zimmermann, Raleigh, NC (US); Stefan Endepols, Burscheid (DE); Christopher R. Hahn, Apex, NC (US)

(73) Assignees: Bayer CropScience LP, St. Louis, MO (US); Bayer CropScience Aktiengesellschaft, Monheim am Rhein (DE)

( * ) Notice: Subject to any disclaimer, the term of this patent is extended or adjusted under 35 U.S.C. 154(b) by 0 days.

(21) Appl. No.: 15/846,479

(22) Filed: Dec. 19, 2017

(65) Prior Publication Data
US 2019/0037829 A1  Feb. 7, 2019
US 2020/0060256 A9  Feb. 27, 2020

Related U.S. Application Data

(60) Provisional application No. 62/541,241, filed on Aug. 4, 2017, provisional application No. 62/443,384, filed on Jan. 6, 2017.

(51) Int. Cl.
*A01M 23/00* (2006.01)
*A01M 31/00* (2006.01)
(Continued)

(52) U.S. Cl.
CPC .......... *A01M 31/002* (2013.01); *A01M 23/00* (2013.01); *A01M 23/245* (2013.01);
(Continued)

(58) Field of Classification Search
CPC ..................................................... A01M 23/00
(Continued)

(56) References Cited

U.S. PATENT DOCUMENTS 1,580,782 A * 4/1926 Gross ....................... H01H 3/02
200/276
1,754,349 A * 4/1930 Bruhlmann .............. H01H 1/54
200/276
(Continued)

FOREIGN PATENT DOCUMENTS

CN  101023743 A  8/2007
DE  20 2004 013928 U1  1/2006
(Continued)

OTHER PUBLICATIONS

International Search Report Issued in Counterpart Application No. PCT/US2017067212, dated Mar. 26, 2018.

*Primary Examiner* — Darren W Ark
(74) *Attorney, Agent, or Firm* — McBee Moore & Vanik IP, LLC

(57) ABSTRACT

An animal trap sensor includes a base having a distal end and a proximal end, a switch having a first metallic element and a second metallic element, and a signal unit, in which, when the first metallic element contacting the second metallic element, thereby forming a closed circuit, such that the signal unit transmits a signal to an off-site receiver. Or, an animal trap sensor includes a first portion and a second portion electrically connected with a signal unit including a power supply, in which, when the first and the second portions are disposed at a first distance between each other,
(Continued)

thereby generating an output property, in which, when the first and the second portions are disposed at a second distance between each other, which is different from the first distance, thereby changing the output property and causing the signal unit to transmit a signal to an off-site receiver.

7 Claims, 21 Drawing Sheets

(51) Int. Cl.
    *A01M 23/24* (2006.01)
    *G01R 33/07* (2006.01)
    *G01R 33/09* (2006.01)
    *G08B 21/18* (2006.01)
    *H01H 1/06* (2006.01)
    *H01H 35/14* (2006.01)
    *H01H 1/24* (2006.01)
    *A01M 25/00* (2006.01)
    *A01M 23/02* (2006.01)
    *A01M 23/30* (2006.01)

(52) U.S. Cl.
    CPC ............ *G01R 33/07* (2013.01); *G01R 33/09* (2013.01); *G01R 33/093* (2013.01); *G08B 21/18* (2013.01); *H01H 1/06* (2013.01); *H01H 1/242* (2013.01); *H01H 35/14* (2013.01); *A01M 23/02* (2013.01); *A01M 23/30* (2013.01); *A01M 25/002* (2013.01); *H01H 35/144* (2013.01)

(58) Field of Classification Search
    USPC .................. 43/58; 200/276, 61.41
    See application file for complete search history.

(56) References Cited

U.S. PATENT DOCUMENTS

| | | | | |
|---|---|---|---|---|
| 2,144,286 | A * | 1/1939 | Dawson | B60Q 9/003 |
| | | | | 200/276 |
| 2,208,697 | A * | 7/1940 | Grisham | B60Q 9/003 |
| | | | | 180/274 |
| 2,270,687 | A * | 1/1942 | Morse | B60Q 9/003 |
| | | | | 200/276 |
| 2,487,922 | A * | 11/1949 | Dechant | B60Q 9/003 |
| | | | | 200/276 |
| 2,651,689 | A * | 9/1953 | Bame | H01H 1/242 |
| | | | | 200/276 |
| 2,881,293 | A * | 4/1959 | Erickson | H01H 1/242 |
| | | | | 200/241 |
| 3,277,256 | A * | 10/1966 | Jones | H01B 7/10 |
| | | | | 200/276 |
| 3,649,787 | A * | 3/1972 | Kasabian | H01H 35/144 |
| | | | | 200/61.45 R |
| 3,731,022 | A * | 5/1973 | Loftus | B62H 5/20 |
| | | | | 200/276 |
| 4,525,699 | A * | 6/1985 | Buck | G01R 31/2836 |
| | | | | 340/512 |
| 4,636,778 | A * | 1/1987 | Corkran | G08B 21/182 |
| | | | | 200/61.41 |
| 4,911,053 | A * | 3/1990 | Kashio | G10H 1/0555 |
| | | | | 84/725 |
| 5,091,715 | A * | 2/1992 | Murphy | G01F 23/242 |
| | | | | 200/61.05 |
| 5,154,017 | A | 10/1992 | Disalvo | |
| 5,301,456 | A * | 4/1994 | Jobin | A01M 1/04 |
| | | | | 43/113 |
| 5,475,372 | A * | 12/1995 | Burke | G01V 1/008 |
| | | | | 200/61.45 R |
| 5,544,777 | A | 8/1996 | Watson | |
| 5,566,502 | A * | 10/1996 | Shigetoyo | A01M 1/2072 |
| | | | | 43/125 |
| 5,863,002 | A | 1/1999 | Noguchi et al. | |
| 5,877,686 | A * | 3/1999 | Ibey | G08B 13/1436 |
| | | | | 200/61.52 |
| 5,877,689 | A * | 3/1999 | D'Amico | F24H 9/165 |
| | | | | 137/312 |
| 6,047,846 | A | 4/2000 | Watson | |
| 6,202,340 | B1 | 3/2001 | Nieves | |
| 6,445,301 | B1 * | 9/2002 | Farrell | A01M 31/002 |
| | | | | 340/384.2 |
| 6,499,488 | B1 | 12/2002 | Martinelli et al. | |
| 6,631,582 | B2 | 3/2003 | Knuppel et al. | |
| 6,542,078 | B2 * | 4/2003 | Script | G08B 13/08 |
| | | | | 340/539.1 |
| 6,661,340 | B1 * | 12/2003 | Saylor | G08B 25/016 |
| | | | | 340/3.3 |
| 6,691,452 | B1 | 2/2004 | Knuppel et al. | |
| 6,724,312 | B1 | 4/2004 | Barber et al. | |
| 6,775,946 | B2 * | 8/2004 | Wright | A01M 21/00 |
| | | | | 43/58 |
| 6,914,529 | B2 | 7/2005 | Barber et al. | |
| 6,937,156 | B2 | 8/2005 | Gardner, Jr. et al. | |
| 7,026,942 | B2 * | 4/2006 | Cristofori | A01M 23/04 |
| | | | | 340/384.2 |
| 7,044,618 | B1 * | 5/2006 | Rapisarda | F21V 23/04 |
| | | | | 200/61.48 |
| 7,212,112 | B2 | 5/2007 | Barber et | |
| 7,212,129 | B2 | 5/2007 | Barber et | |
| 7,262,702 | B2 | 8/2007 | Barber et al. | |
| 7,317,399 | B2 * | 1/2008 | Chyun | A01M 1/026 |
| | | | | 340/286.01 |
| 7,348,890 | B2 | 3/2008 | Barber et al. | |
| 7,395,161 | B2 | 7/2008 | David | |
| 7,509,770 | B2 * | 3/2009 | Gardner, Jr. | A01M 1/026 |
| | | | | 43/107 |
| 7,530,195 | B2 * | 5/2009 | Muller | A01M 23/12 |
| | | | | 43/58 |
| 7,656,300 | B2 * | 2/2010 | Ronnau | A01M 1/026 |
| | | | | 340/506 |
| 7,719,429 | B2 | 5/2010 | Barber et al. | |
| 7,968,812 | B2 * | 6/2011 | Phelps | F16F 9/029 |
| | | | | 200/276 |
| 8,026,822 | B2 * | 9/2011 | Borth | A01M 1/026 |
| | | | | 340/573.2 |
| 8,112,934 | B2 * | 2/2012 | Alter | A01M 31/002 |
| | | | | 43/58 |
| 8,156,683 | B2 * | 4/2012 | Slotnick | A01M 31/002 |
| | | | | 43/81 |
| 8,269,634 | B2 * | 9/2012 | Fischell | A61B 5/0031 |
| | | | | 340/573.1 |
| 8,418,396 | B2 | 4/2013 | Moustirats | |
| 8,479,440 | B2 * | 7/2013 | DeMonte | A01M 1/2094 |
| | | | | 126/110 B |
| 8,599,026 | B2 * | 12/2013 | Lloyd | A01M 31/002 |
| | | | | 340/573.2 |
| 8,635,806 | B2 * | 1/2014 | Gardner, Jr. | A01M 1/026 |
| | | | | 43/107 |
| 8,830,071 | B2 * | 9/2014 | Borth | A01M 1/026 |
| | | | | 340/573.2 |
| 8,941,483 | B2 * | 1/2015 | Davis | G08B 21/24 |
| | | | | 126/42 |
| 9,015,987 | B2 * | 4/2015 | Moran | A01M 23/16 |
| | | | | 340/573.2 |
| 9,237,743 | B2 | 1/2016 | Gaskamp et al. | |
| 9,380,775 | B2 | 1/2016 | Frojmovics | |
| 9,510,582 | B2 | 12/2016 | David et al. | |
| 9,542,835 | B2 | 1/2017 | Borth et al. | |
| 9,743,657 | B2 | 8/2017 | Rich et al. | |
| 10,085,133 | B2 | 9/2018 | Borth et al. | |
| 10,111,416 | B2 | 10/2018 | Rich et al. | |
| 10,152,035 | B2 | 12/2018 | Reid et al. | |
| 10,357,027 | B2 * | 7/2019 | Othon | A01M 25/004 |
| 10,448,627 | B2 | 10/2019 | Austin et al. | |
| 10,477,854 | B1 | 11/2019 | Yang | |
| 10,477,855 | B2 | 11/2019 | Power | |
| 10,499,633 | B2 | 12/2019 | Rich et al. | |
| 10,531,653 | B2 | 1/2020 | Pinzone et al. | |
| 10,798,541 | B2 * | 10/2020 | Stapleford | A01M 23/16 |

(56) References Cited

U.S. PATENT DOCUMENTS

| | | |
|---|---|---|
| 10,849,320 B2 * | 12/2020 | Files .................... A01M 23/38 |
| 2001/0009399 A1 | 7/2001 | Barber et al. |
| 2001/0033230 A1 | 10/2001 | Barber et al. |
| 2001/0054962 A1 | 12/2001 | Barber |
| 2002/0101352 A1 | 8/2002 | Barber |
| 2002/0167409 A1 | 11/2002 | Cristofori |
| 2003/0001745 A1 | 1/2003 | Barber et al. |
| 2003/0151973 A1 | 8/2003 | Gartland et al. |
| 2003/0184442 A1 | 10/2003 | Gardner, Jr. et al. |
| 2003/0213161 A1 | 11/2003 | Gardner, Jr. et al. |
| 2004/0020100 A1 | 2/2004 | O'Brien et al. |
| 2004/0140900 A1 | 7/2004 | Barber |
| 2004/0216364 A1 * | 11/2004 | Gosselin ............... A01M 23/08 43/61 |
| 2004/0228209 A1 | 11/2004 | Bielozer |
| 2006/0149509 A1 | 7/2006 | Chyun |
| 2006/0150470 A1 | 7/2006 | Ronnau |
| 2007/0120690 A1 | 5/2007 | Barber |
| 2007/0192032 A1 | 8/2007 | David |
| 2008/0204253 A1 * | 8/2008 | Cottee ................. A01M 23/245 340/573.2 |
| 2008/0224827 A1 | 9/2008 | Barber et al. |
| 2009/0192763 A1 | 7/2009 | Gardner, Jr. et al. |
| 2009/0193707 A1 | 8/2009 | Moran et al. |
| 2010/0134301 A1 | 6/2010 | Borth et al. |
| 2011/0083358 A1 | 4/2011 | Slotnick |
| 2011/0109460 A1 | 5/2011 | Lloyd et al. |
| 2012/0212338 A1 | 8/2012 | Borth et al. |
| 2013/0342344 A1 * | 12/2013 | Kramer ................. A01M 23/00 340/539.1 |
| 2014/0075824 A1 * | 3/2014 | Roulston .............. A01M 1/023 43/107 |
| 2014/0085100 A1 | 3/2014 | Rich et al. |
| 2014/0279600 A1 * | 9/2014 | Chait ................... G06Q 30/018 705/317 |
| 2014/0283435 A1 * | 9/2014 | Galeb ................. A01M 23/005 43/107 |
| 2014/0300477 A1 | 10/2014 | Rich et al. |
| 2014/0325892 A1 | 11/2014 | Borth et al. |
| 2015/0165396 A1 | 6/2015 | Mattson et al. |
| 2015/0208636 A1 | 7/2015 | David et al. |
| 2016/0012703 A1 | 1/2016 | Moran et al. |
| 2016/0086475 A1 | 3/2016 | Rich et al. |
| 2016/0192635 A1 | 7/2016 | Rich et al. |
| 2017/0195824 A1 | 7/2017 | Borth et al. |
| 2017/0215407 A1 | 8/2017 | Pinzone et al. |
| 2017/0238521 A1 | 8/2017 | Flint et al. |
| 2018/0096581 A1 | 4/2018 | Daly, Jr. |
| 2018/0116200 A1 * | 5/2018 | Rich ...................... G08B 21/18 |
| 2018/0199565 A1 * | 7/2018 | Zosimadis .............. H04W 4/00 |
| 2018/0235205 A1 | 8/2018 | Howard et al. |
| 2018/0271083 A1 | 9/2018 | Crezee |
| 2018/0299842 A1 | 10/2018 | Reid et al. |
| 2019/0008131 A1 | 1/2019 | Austin et al. |
| 2019/0037829 A1 | 2/2019 | Laut et al. |
| 2019/0059355 A1 | 2/2019 | Samuelson |
| 2019/0121302 A1 | 4/2019 | Reid et al. |
| 2019/0124913 A1 | 5/2019 | Power |
| 2019/0216076 A1 | 7/2019 | Rich et al. |
| 2020/0005626 A1 * | 1/2020 | Triventi ................ A01M 23/38 |
| 2020/0060256 A9 | 2/2020 | Laut et al. |

FOREIGN PATENT DOCUMENTS

| | | | |
|---|---|---|---|
| DE | 202014100239 U1 | 6/2015 | |
| JP | 6313070 B2 * | 4/2018 | |
| JP | 2018050540 A * | 4/2018 | |
| KR | 100863112 B1 * | 10/2008 | |
| KR | 20080109307 A * | 12/2008 | |
| WO | 200106851 A1 | 2/2001 | |
| WO | 200226033 A1 | 4/2002 | |
| WO | 200313237 A2 | 2/2003 | |
| WO | 03084320 A1 | 10/2003 | |
| WO | 200379779 A1 | 10/2003 | |
| WO | 200384321 A1 | 10/2003 | |
| WO | 200421735 A1 | 3/2004 | |
| WO | 2004110142 A8 | 2/2005 | |
| WO | 200726123 A1 | 3/2007 | |
| WO | 200794974 A1 | 8/2007 | |
| WO | 201030346 A1 | 3/2010 | |
| WO | WO-2013017941 A1 * | 2/2013 | ............ A01M 23/18 |
| WO | 201363670 A1 | 5/2013 | |
| WO | 2013137919 A1 | 9/2013 | |
| WO | 2015179899 A1 | 12/2015 | |
| WO | WO-2015185063 A1 * | 12/2015 | ............ A01M 23/24 |
| WO | 2016073429 A1 | 5/2016 | |
| WO | 201711916 A1 | 1/2017 | |
| WO | 2017116985 | 7/2017 | |
| WO | 2017149163 A1 | 9/2017 | |
| WO | WO-2017149163 A1 * | 9/2017 | ............ A01M 23/26 |
| WO | 201842235 | 3/2018 | |
| WO | 201863983 A1 | 4/2018 | |
| WO | 2018128799 A1 | 7/2018 | |
| WO | 2018174715 A1 | 9/2018 | |
| WO | 2018174715 B1 | 9/2018 | |
| WO | 2018189293 A1 | 10/2018 | |
| WO | 201910365 A1 | 1/2019 | |
| WO | 201940648 A1 | 2/2019 | |

* cited by examiner

SENSOR FOR A WIRELESS ANIMAL TRAP DETECTION SYSTEM

CROSS-REFERENCE TO RELATED APPLICATIONS

This application claims priority to U.S. Provisional Application No. 62/443,384, filed on Jan. 6, 2017, and U.S. Provisional Application No. 62/541,241, filed on Aug. 4, 2017, the entire contents of which are hereby incorporated by reference.

BACKGROUND OF INVENTION

Field of the Invention

The invention relates generally to the field of trap monitoring systems. More specifically, the invention relates to sensors, e.g., trembler switches, used in animal traps or bait stations, which utilize wireless alert systems. The invention also relates to sensors, such as Hall effect sensors, for use in animal trap monitoring systems.

Background Art

The present application relates to wireless reporting of events and more particularly to wireless reporting of status of animal traps or bait stations.

Animal traps have been in use for years, and the majority of these devices use either a spring load or live trap device. Animal traps are frequently placed in many locations and may also be moved about as needs arise elsewhere. While these devices may be suitable for easy to monitor locations, they are not suitable for remote hard to monitor locations. One problem with these conventional traps is that they are often placed, for example, in an attic in a house, and there is no easy way of knowing when the trap is activated other than by viewing them. Another problem with live traps is that the animal may be left in a very stressful environment when stuck in the trap for many hours or even days before the activated trap is discovered. An example of this stressful environment is when a live trap is placed in an attic that may reach temperatures in excess of 120° F. Another problem with the standard spring-loaded trap is that an animal is often left for extended periods of time to the point that they begin to decay attracting even more animals.

Further, an individual ordinarily must remember where each trap has been placed and frequently check the traps visually to see whether they have been sprung so that they can be re-set and re-baited. The task of trap checking is made even more critical in certain sensitive establishments (e.g., commercial food) or for wildlife (e.g., raccoon, squirrels, nutria species . . . ) where prevailing laws invoke penalties if an animal has been trapped for too long a period of time.

Therefore, animal trap activation detection systems have been able to provide basic on/off alert information to users with very limited and narrow applications. Examples of this include a spring-loaded trap that sounds a local audio signal when activated. While this attempts to solve the problem of alerting that a remote trap has been activated, it does not solve the fundamental problem if the trap is a considerable distance from the trap user. In addition, the battery operated audio device has the disadvantage of causing the battery to run down. Another type of alert system uses sophisticated and expensive sensing techniques, such as infrared or motion sensors, which alert the trap user once a trap activation has been detected. Still other alert systems use various imaging systems to report the presence of an animal in a trap, however, transmitting of digital images has a high bandwidth and energy demands. The expense and sophistication of these devices may limit their use in a high volume low-tech field, such as pest control. In general, these prior approaches are too expensive, too sophisticated, and have a narrow scope of application.

US 2004/0020100 discloses an alert system, in which a battery operated wireless radio frequency (RF) sensor/transmitter is incorporated with traps, such as live trap and spring-loaded trap, along with a receiver configured to receive signals from the wireless RF transmitter.

U.S. Pat. No. 9,380,775 discloses a device powered by a long-life battery for monitoring and communicating the status of traps for vermin or pests. After an alarm is triggered, the device transmits a wireless communication to a server, which interprets the communication to determine the nature and origin of the alarm and send the communication to a user.

U.S. Pat. No. 8,418,396 discloses a humane animal trap having a trigger circuit coupled with an electronic sensor. The trigger circuit includes a detection circuit for determining the presence of an animal inside the trap. A wireless alert circuit may be coupled to the detector circuit to provide for remote signaling of an alarm unit when the animal trap has been tripped.

U.S. Pat. No. 6,775,946 discloses wireless transmitters in association with each of a plurality of animal traps and a central display unit, which receives signals from the traps and displays indicia of the state of the trap. When an animal takes the bait and springs the trap, the movable portion of the trap moves to catch the animal. The sensor will detect the movement of the movable member and, when controller next reads the sensor, a signal will be sent to the display unit to reflect the state change.

U.S. Pat. No. 8,026,822 discloses a pest control device, which includes circuitry having a component, such as Hall effect device or magnetoresistor, responsive to a magnetic field proximate to the pest control device to operate the transceiver in an installation mode.

U.S. Pat. No. 9,015,987 discloses an apparatus for monitoring an animal trap having a movable trapping member, which is movable between a set state and an actuated state. The apparatus includes a sensor arranged to sense a state of the movable trapping member. The sensor may include Hall effect sensor or magnetic switch.

A need remains for a detection system, that uses simple and inexpensive sensing technology, with minimal bandwidth and energy demands, that is well adapted for high-volume, low-cost fields such as pest control and allow an operator to easily identify which of a plurality of animal traps needs to be tended to.

SUMMARY OF INVENTION

In one aspect, the embodiments disclosed herein relate to an animal trap sensor including a base having a distal end and a proximal end, a switch having a first metallic element and a second metallic element, and a signal unit, in which the first metallic element and the second metallic element are electrically separated at the distal end of the base and electrically connected with the signal unit at the proximal end of the base, thereby forming an open circuit, in which, when the first metallic element contacting the second metallic element, thereby forming a closed circuit, such that the signal unit transmits a signal to an off-site receiver.

In another aspect, the embodiments disclosed herein relate to an animal trap sensor including a test mode control mechanism for initiating a test mode, in which, when the test mode is initiated, if the off-site receiver receives the signal to register a capture event, this indicates that the animal sensor may be operational, and if the off-site receiver does not receive the signal, this indicates that the animal sensor may not be operational.

In another aspect, the embodiments disclosed herein relate to an animal trap sensor including an accelerometer that measures acceleration in one or more axes of the sensor such that, when the acceleration exceeds a pre-set acceleration threshold value, the sensor is adapted to provide a move signal to the off-site receiver, indicating that the sensor has been moved and may not be operational.

In another aspect, the embodiments disclosed herein relate to an animal trap system including an animal trap and the animal trap sensor, which includes a base having a distal end and a proximal end, a switch having a first metallic element and a second metallic element, and a signal unit, in which the first metallic element and the second metallic element are electrically separated at the distal end of the base and electrically connected with the signal unit at the proximal end of the base, thereby forming an open circuit, in which, when the first metallic element contacting the second metallic element, thereby forming a closed circuit, such that the signal unit transmits a signal to an off-site receiver.

In another aspect, the embodiments disclosed herein relate to an animal trap system including a test mode control mechanism for initiating a test mode, in which, when the test mode is initiated, if the off-site receiver receives the signal to register a capture event, indicating that the animal sensor may be operational; and if the off-site receiver does not receive the signal, indicating that the animal sensor may not be operational.

In another aspect, the embodiments disclosed herein relate to an animal trap system including an accelerometer that measures acceleration in one or more axes of the sensor such that, when the acceleration exceeds a pre-set acceleration threshold value, the sensor is adapted to provide a move signal to the off-site receiver, indicating that the sensor has been moved and may not be operational.

In another aspect, the embodiments disclosed herein relate to an animal trap system including a divider disposed inside the trap between a main chamber of the trap and a trap entrance, in which the divider has an opening leading to the main chamber, in which the switch is disposed inside the trap between the opening and the trap entrance, such that an animal entering the main chamber through the opening will cause the first metallic element to contact the second metallic element.

In another aspect, the embodiments disclosed herein relate to a bait station containing the animal trap sensor, which includes a base having a distal end and a proximal end, a switch having a first metallic element and a second metallic element, and a signal unit, in which the first metallic element and the second metallic element are electrically separated at the distal end of the base and electrically connected with the signal unit at the proximal end of the base, thereby forming an open circuit, in which, when the first metallic element contacting the second metallic element, thereby forming a closed circuit, such that the signal unit transmits a signal to an off-site receiver, in which the first metallic element contacting the second metallic element by an animal directly or indirectly triggering the switch.

In another aspect, the embodiments disclosed herein relate to a bait station containing a test mode control mechanism for initiating a test mode, in which, when the test mode is initiated, if the off-site receiver receives the signal to register a capture event, indicating that the animal sensor may be operational; and if the off-site receiver does not receive the signal, indicating that the animal sensor may not be operational.

In another aspect, the embodiments disclosed herein relate to a bait station containing an accelerometer that measures acceleration in one or more axes of the sensor such that, when the acceleration exceeds a pre-set acceleration threshold value, the sensor is adapted to provide a move signal to the off-site receiver, indicating that the sensor has been moved and may not be operational.

In another aspect, the embodiments disclosed herein relate to a method of trapping an animal including providing an animal trap, disposing the animal trap sensor unto the animal trap, in which the animal trap sensor includes a base having a distal end and a proximal end, a switch having a first metallic element and a second metallic element, and a signal unit, in which the first metallic element and the second metallic element are electrically separated at the distal end of the base and electrically connected with the signal unit at the proximal end of the base, thereby forming an open circuit, in which, when the first metallic element contacting the second metallic element, thereby forming a closed circuit, such that the signal unit transmits a signal to an off-site receiver, contacting the first metallic element with the second metallic element, when the animal trap is tripped, thereby forming the closed circuit, and sending the signal to the off-site receiver to register a capture event.

In another aspect, the embodiments disclosed herein relate to a method of trapping an animal including optionally initiating a test mode and sending a signal to the off-site receiver, in which, when the test mode is initiated, if the off-site receiver receives the signal to register a capture event, indicating that the animal sensor may be operational; and if the off-site receiver does not receive the signal, indicating that the animal sensor may not be operational; optionally moving the sensor and sending a move signal to the off-site receiver, in which the move signal indicates the sensor has been moved and may not be operational; contacting the first metallic element with the second metallic element, when the animal trap is tripped, thereby forming the closed circuit; and sending the signal to the off-site receiver to register a capture event.

In yet another aspect, the embodiments disclosed herein relate to use of the animal trap sensor for registering a capture event of an animal in a trap, in which the animal trap sensor includes a base having a distal end and a proximal end, a switch having a first metallic element and a second metallic element, and a signal unit, in which the first metallic element and the second metallic element are electrically separated at the distal end of the base and electrically connected with the signal unit at the proximal end of the base, thereby forming an open circuit, in which, when the first metallic element contacting the second metallic element, thereby forming a closed circuit, such that the signal unit transmits a signal to an off-site receiver.

In another aspect, the embodiments disclosed herein relate to use of the animal trap sensor for registering a capture event of an animal in a trap, in which the animal trap sensor may include a test mode control mechanism for initiating a test mode, in which, when the test mode is initiated, if the off-site receiver receives the signal to register a capture event, indicating that the animal sensor may be operational; and if the off-site receiver does not receive the signal, indicating that the animal sensor may not be operational.

In another aspect, the embodiments disclosed herein relate to use of the animal trap sensor for registering a capture event of an animal in a trap, in which the animal trap sensor may include an accelerometer that measures acceleration in one or more axes of the sensor such that, when the acceleration exceeds a pre-set acceleration threshold value, the sensor is adapted to provide a move signal to the off-site receiver, indicating that the sensor has been moved and may not be operational.

In another aspect, the embodiments disclosed herein relate to a method of monitoring an animal trap system using a sensor including testing the sensor including initialing the test mode, contacting the first metallic element with the second metallic element, in which, if the off-site receiver receives the signal to register a capture event, this indicates that the animal sensor may be operational; and if the off-site receiver does not receive the signal, this indicates that the animal sensor may not be operational, exiting the test mode, and monitoring a capture event.

In yet another aspect, the embodiments disclosed herein relate to an animal trap sensor including a first portion and a second portion electrically connected with a signal unit including a power supply, in which, when the first and the second portions are disposed at a first distance between each other, thereby generating an output property, in which, when the first and the second portions are disposed at a second distance between each other, which is different from the first distance, thereby changing the output property and causing the signal unit to transmit a signal to an off-site receiver.

Other aspects and advantages of the invention will be apparent from the following description and the appended claims.

DETAILED DESCRIPTION

The present application relates to wireless reporting of events and more particularly to wireless reporting of status of animal traps or bait stations.

Animal traps or bait stations are frequently placed in many locations and then moved about as needs arise elsewhere. Wireless reporting of status of animal traps or bait stations in remote hard to monitor locations, e.g., in an attic in a house, may require battery to power detection and transmission of signals to users. Constant drain of battery shortens battery life may result in spent battery rendering monitoring systems inoperable.

Embodiments of the present disclosure include animal sensors, e.g., trembler switches, for detecting the presence of animals in traps or bait stations. For example, trembler switches may contain closed or open electric circuit indicators. When an animal directly or indirectly triggers switches by hitting or oscillating switches (or switches vibrating in response to mechanical door slamming shut), the circuit is closed and communication signals are distributed through a wireless network to register a capture event. That helps with battery life as the majority of the time the electric circuit is open and no power is drained.

Figure 1A:
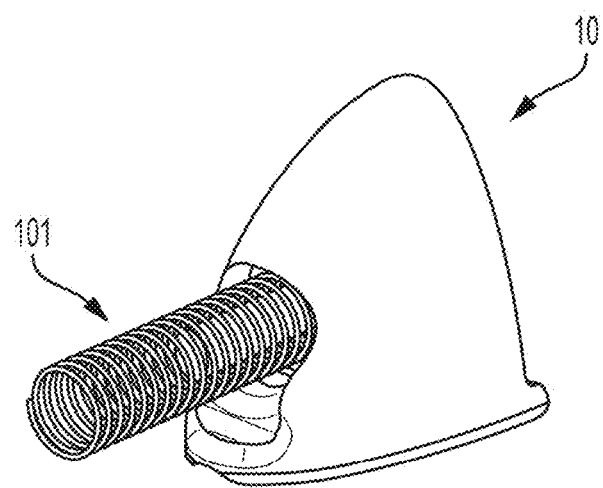
FIG. 1A shows an animal trap sensor in accordance with one embodiment of the present disclosure.
Figure 1B:
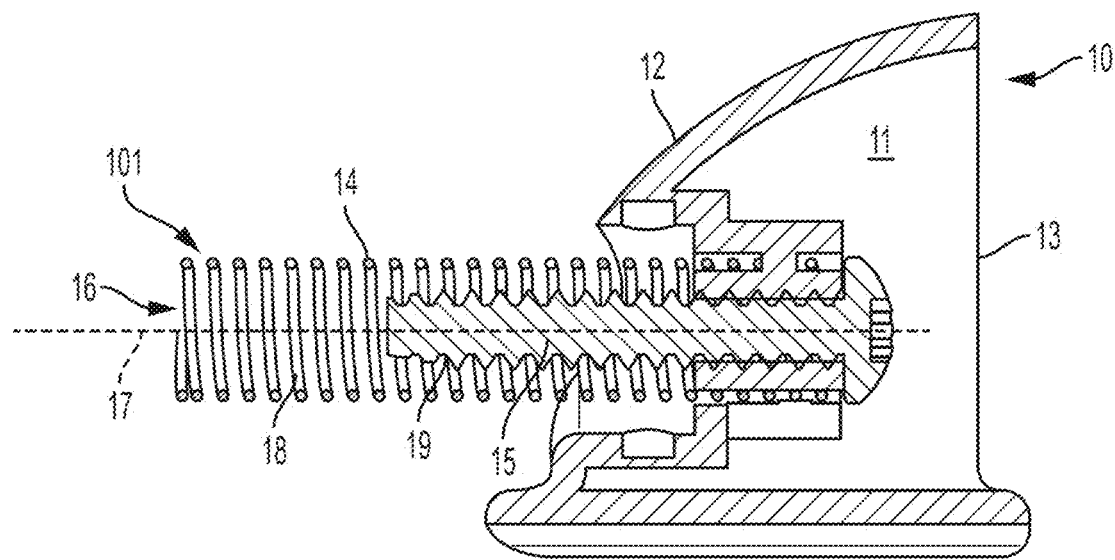
FIG. 1B shows a cross-section view of animal trap sensor shown in FIG. 1A.

FIG. 1A shows animal trap sensor 10 in accordance with one embodiment of the invention. FIG. 1B shows a cross-section view of animal trap sensor 10 shown in FIG. 1A. Animal trap sensor 10 may include base 11 having a distal end 12 and a proximal end 13, switch 101 having a first metallic element 14 and a second metallic element 15, and signal unit 30 (see FIG. 3) having transmitters and batteries, which are used to power transmission of signals to users. In contrast to short range and high power consumption technologies, such as Wi-Fi, Bluetooth and ZigBee, signal unit 30 may use Low Power Wide Area (LPWA) technologies, such as Ultra-narrowband (e.g., Sigfox), Spread-spectrum (e.g., LORA) or Narrowband (e.g., Weightless-P) technologies that allow longer range communication and consume less power.

The first metallic element 14 and the second metallic element 15 are electrically separated, e.g., without physically contacting each other, at the distal end 12 of base 11 and are electrically connected with signal unit 30 at the proximal end 13 of base 11, thereby forming an open circuit. For example, an electrical wire may be soldered to the first metallic element 14 and another to the second metallic element 15 at the proximal end 13 of base 11.

The first metallic element 14 may have hollow region 16 along a longitudinal axis 17 of the first metallic element 14. Hollow region 16 may be configured to sleeve the second metallic element 15 such that an inside surface 18 of the first metallic element 14 surrounds an outside surface 19 of the second metallic element 15. When switch 101 is directly or indirectly triggered, e.g., oscillated or hit, that, in turn, causes the inside surface 18 of the first metallic element 14 to contact the outside surface 19 of the second metallic element 15, thereby forming a closed circuit, such that signal unit 30 (see FIGS. 1G and 1H) transmits signal 32 (see FIGS. 1G and 1H) to off-site receiver 34 (see FIG. 3). Signal 32 may be transmitted wirelessly, e.g., RF signals. The first metallic element 14 may be a flexible metallic element, e.g., spring, cylindrical or cone-shaped pipe.

Figure 1C:
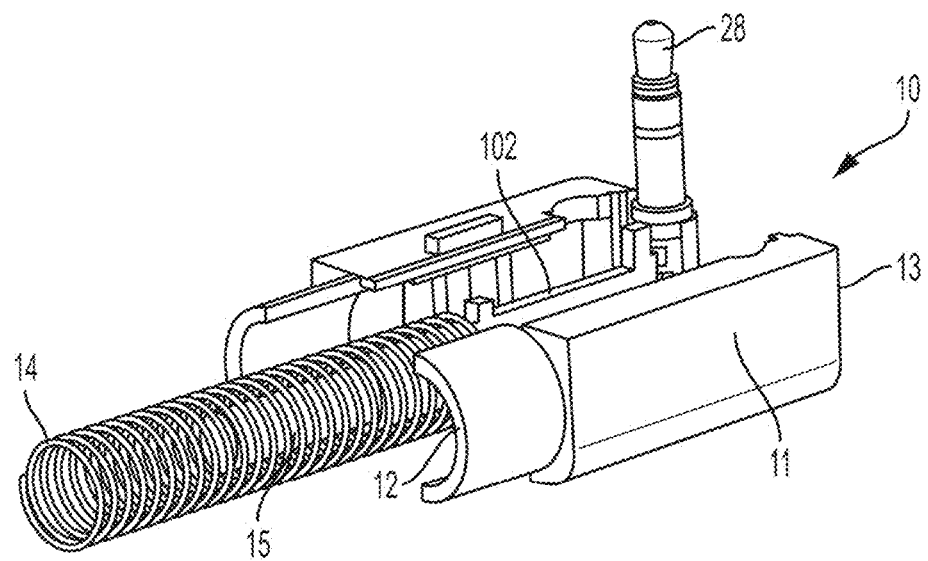
FIG. 1C-1F show an animal trap sensor in accordance with another embodiment of the present disclosure.
Figure 1D:
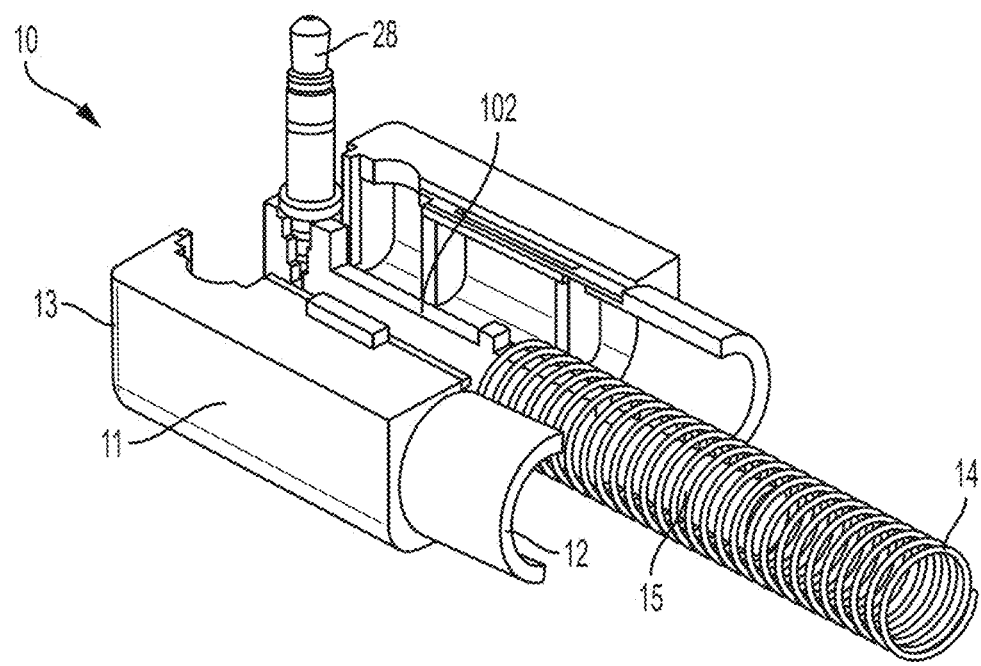
Figure 1E:
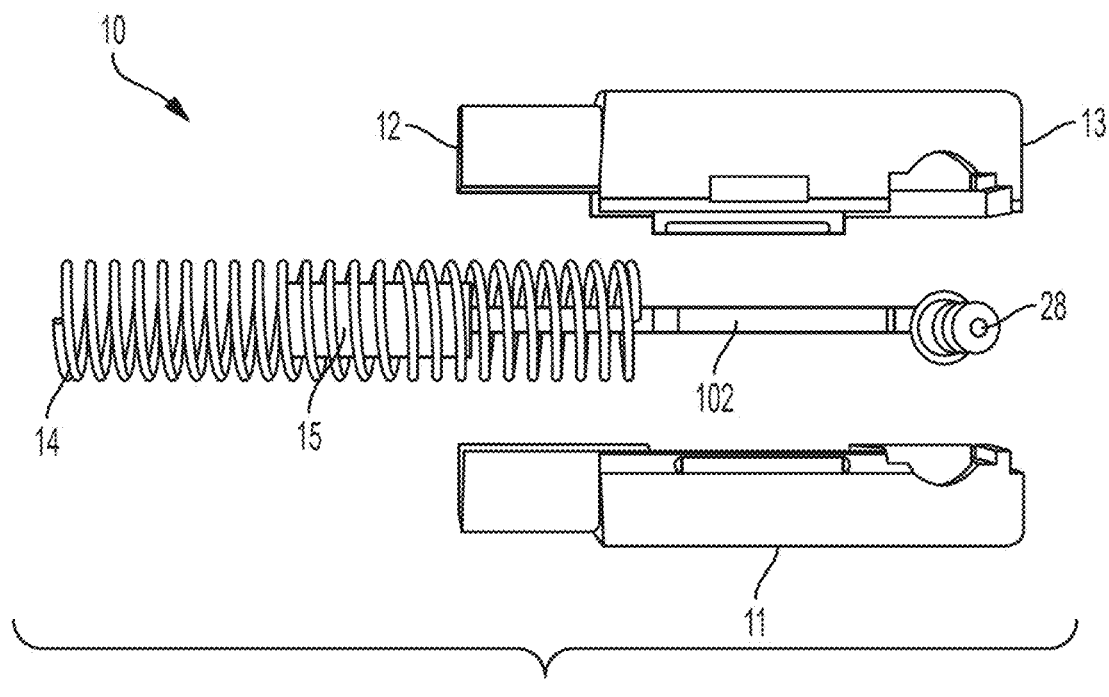
Figure 1F:
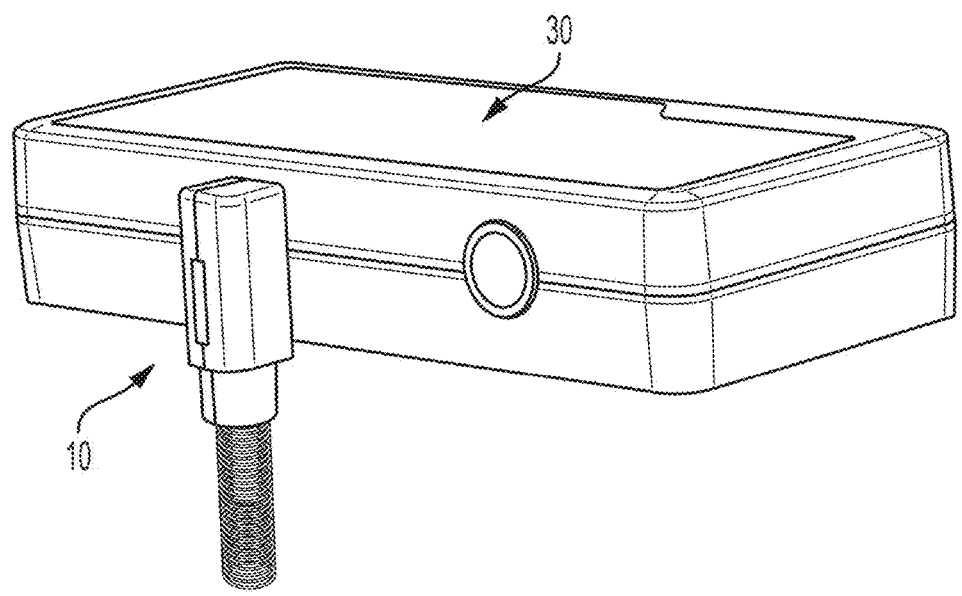

FIG. 1C-1E show inside views of animal trap sensor 10 in accordance with another embodiment of the present disclosure. Connections of the first and the second metallic elements 14, 15 at the proximal end 13 of base 11 may be integrated into printed circuit board (PCB) 102 such that the first metallic element 14 and the second metallic element 15 are electrically separated at the distal end 12 of the base 11 and electrically connected with signal unit 30 (FIG. 1F) via electrical conductor 28 at the proximal end 13 of base 11, thereby forming an open circuit. The printed circuit board (PCB) 102 may also help center the second metallic element 15 disposed within the first metallic element 14.

Figure 1G:
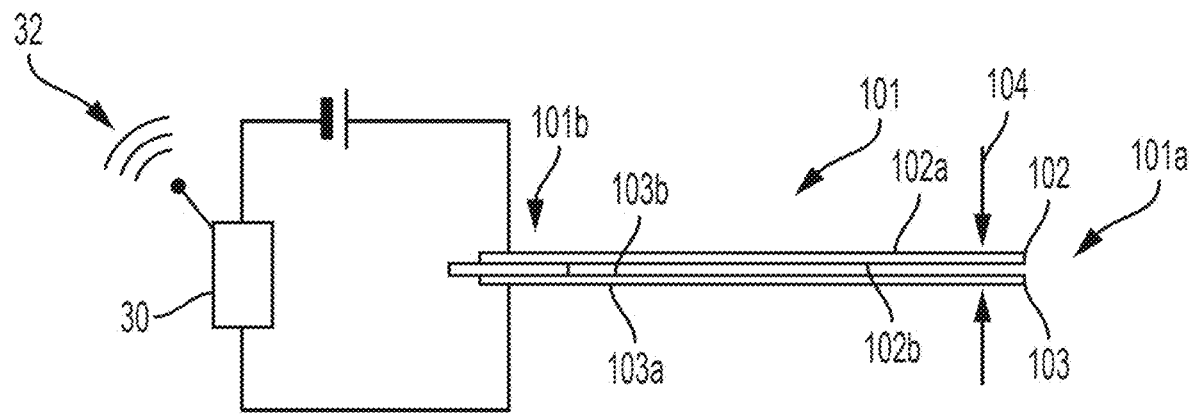
FIG. 1G shows an animal trap sensor in accordance with another embodiment of the present disclosure.
Figure 1H:
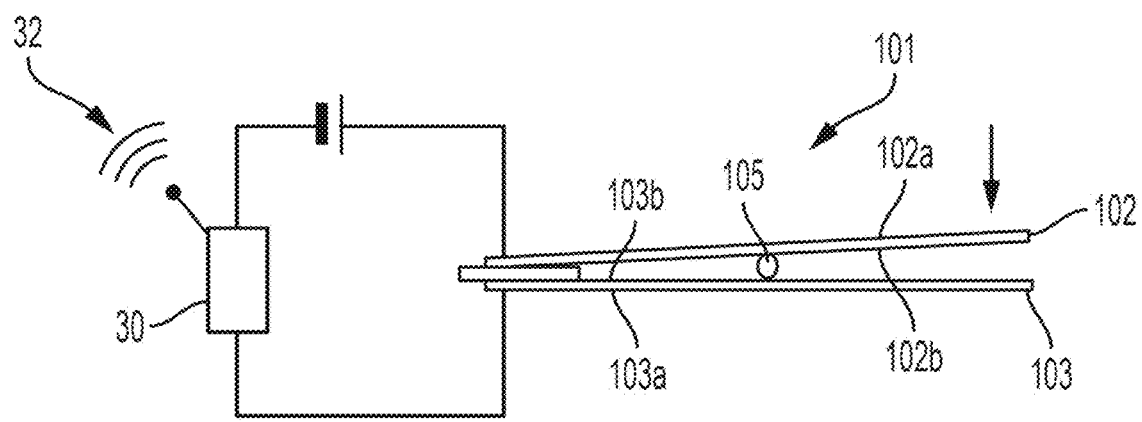
FIG. 1H shows an animal trap sensor in accordance with another embodiment of the present disclosure.

Other embodiments of the invention include, as shown in FIGS. 1G and 1H, switch 101 having the first 102 and the second 103 metallic elements in the form of tongue or plate. Each of which have an outside surface 102a, 103a and an inside surface 102b, 103b, such that the inside surface 102b of the first metallic element 102 and the inside surface 103b of the second metallic element 103 are opposite to each other.

FIG. 1G shows another embodiment of the invention. The first metallic element 102 and the second metallic element 103 are electrically separated, e.g., without physically contacting each other, at the distal end 101a of switch 101 and are electrically connected with signal unit 30 at the proximal end 101b of switch 101, thereby forming an open circuit. The first metallic element 102 and the second metallic element 103 may contact each other by force 104 (as indicated by arrows), e.g., a vertical force, caused by an animal either stepping onto one or both of the outside surfaces 102a, 103a, or by an animal contacting switch 101, thus, pressing one element against the other, such that the inside surface 102b of the first metallic element 102 contacts the inside surface 103b of the second metallic element 103, thereby forming a closed circuit, such that signal unit 30 transmits signal 32 to off-site receiver 34 (see FIG. 3).

FIG. 1H shows yet another embodiment of the invention. Switch 101 may have electrical insulator 105 disposed between the inside surfaces 102b, 103b of the first and the second metallic elements 102, 103 such that the first metallic element 102 forms a seesaw-like structure on the inside surface 103b of the second metallic element 103 or vice versa, using electrical insulator 105 as pivot. For example, the first metallic element 102 may contact the second metallic element 103 by a seesaw movement (as indicated by an arrow) of the first metallic element 102 such that the inside surface 102b of the first metallic element 102 contacts the inside surface 103b of the second metallic element 103, thereby forming the closed circuit.

The metallic elements 14, 15, 102, 103 of switch 101 may have sharp edges causing a captured animal to avoid contacting switch 101 with sufficient force to bring the first metallic element 14 or 102 into contact with the second metallic element 15 or 103, respectively. Thus, despite the animal being captured in the trap, the circuit remains open and no signal is generated nor transmitted to the off-site receiver 34. To eliminate risks of such false negative, i.e., captured animals not triggering switch 101, a sleeve may be used to sheath the metallic elements 14, 15, 102, 103, such that the sharp edges, which cause avoidance, are shielded. Thus, switch 101 may no longer be avoided by captured animals. Sleeve can be made of any suitable materials, such as fabric, plastic, paper, or a combination thereof.

In certain trap configurations, enough space may exist between switch 101 and the interior trap surfaces (sides or edges) such that small, juvenile animals caught in the trap may be allowed to avoid contact with the metallic elements 14, 15, 102, 103 of switch 101. To eliminate risks of such false negative, i.e., captured animals not triggering switch 101, the metallic elements 14, 15, 102, 103 may be sheathed in a conical or other shaped design, which may create an expanded trigger area to increase the likelihood of contact by even the smallest animals. For example, a movement of the sleeve caused by captured animals may bring the first metallic element 14, 102 into contact with the second metallic element 15, 103, respectively, thereby, closing the circuit and generating signal 32 transmitted to off-site receiver 34.

Figure 2A:
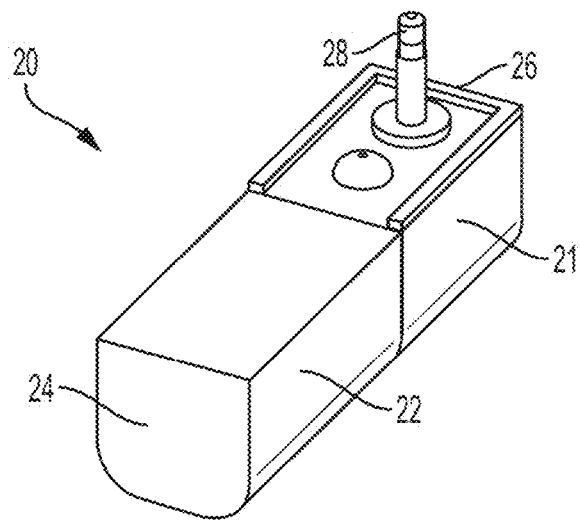
FIG. 2A shows an animal trap sensor in accordance with another embodiment of the present disclosure.
Figure 2B:
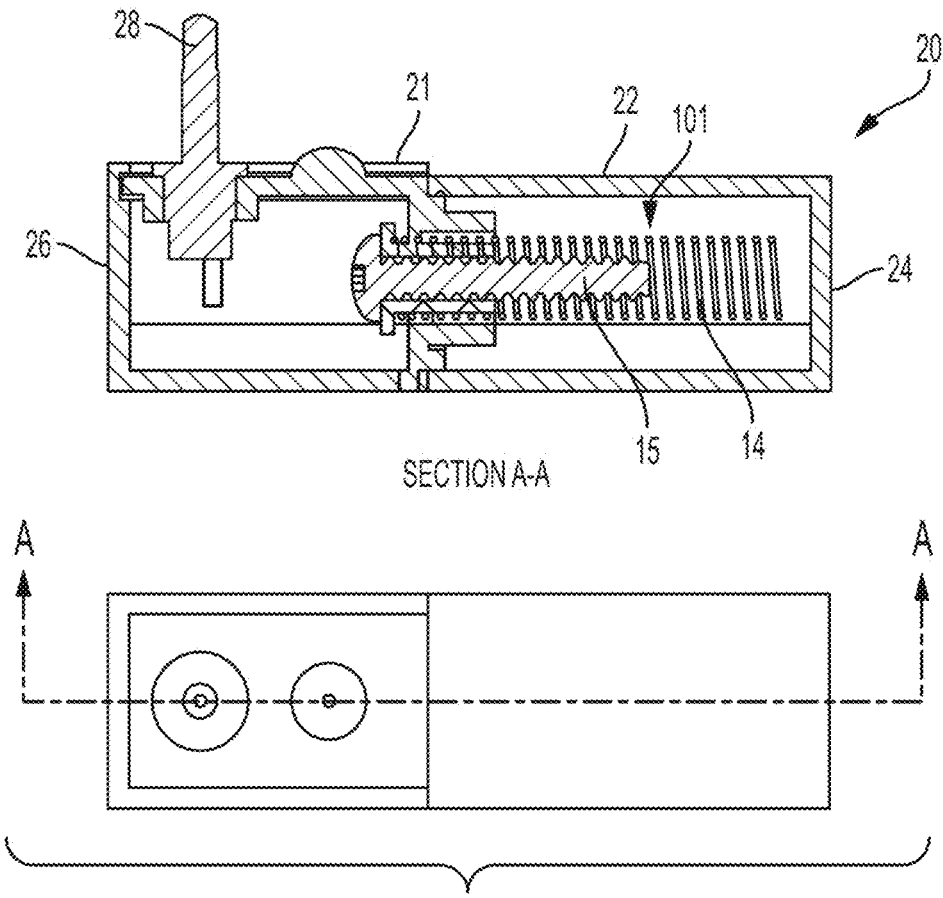
FIG. 2B shows a cross-section (A-A) view of animal trap sensor shown in FIG. 2A.

FIG. 2A shows animal trap sensor 20 in accordance with another embodiment of the present disclosure. FIG. 2B shows a cross-section (A-A) view of animal trap sensor 20 shown in FIG. 2A. The first metallic element 14 and the second metallic element 15 are electrically separated at the distal end 24 of the base 21 and electrically connected with signal unit 30 (see FIG. 3) via electrical conductor 28 at the proximal end 26 of base 21, thereby forming an open circuit. When switch 101 is triggered, e.g., oscillated or hit, that, in turn, causes the first metallic element 14 to contact the second metallic element 15, thereby forming a closed circuit, such that signal unit 30 transmits signal 32 (see FIG. 3) to off-site receiver 34 (see FIG. 3).

Animal trap sensor 20 may optionally have housing 22 that encloses switch 101. Housing 22 may prevent switch 101 from being inadvertently triggered, e.g., oscillated or hit and, in turn, causing the first metallic element 14 to contact the second metallic element 15 due to environmental factors, e.g., dust, debris, partial immersion in water, etc., thus, mitigating contamination and minimizing false positives.

Figure 3:
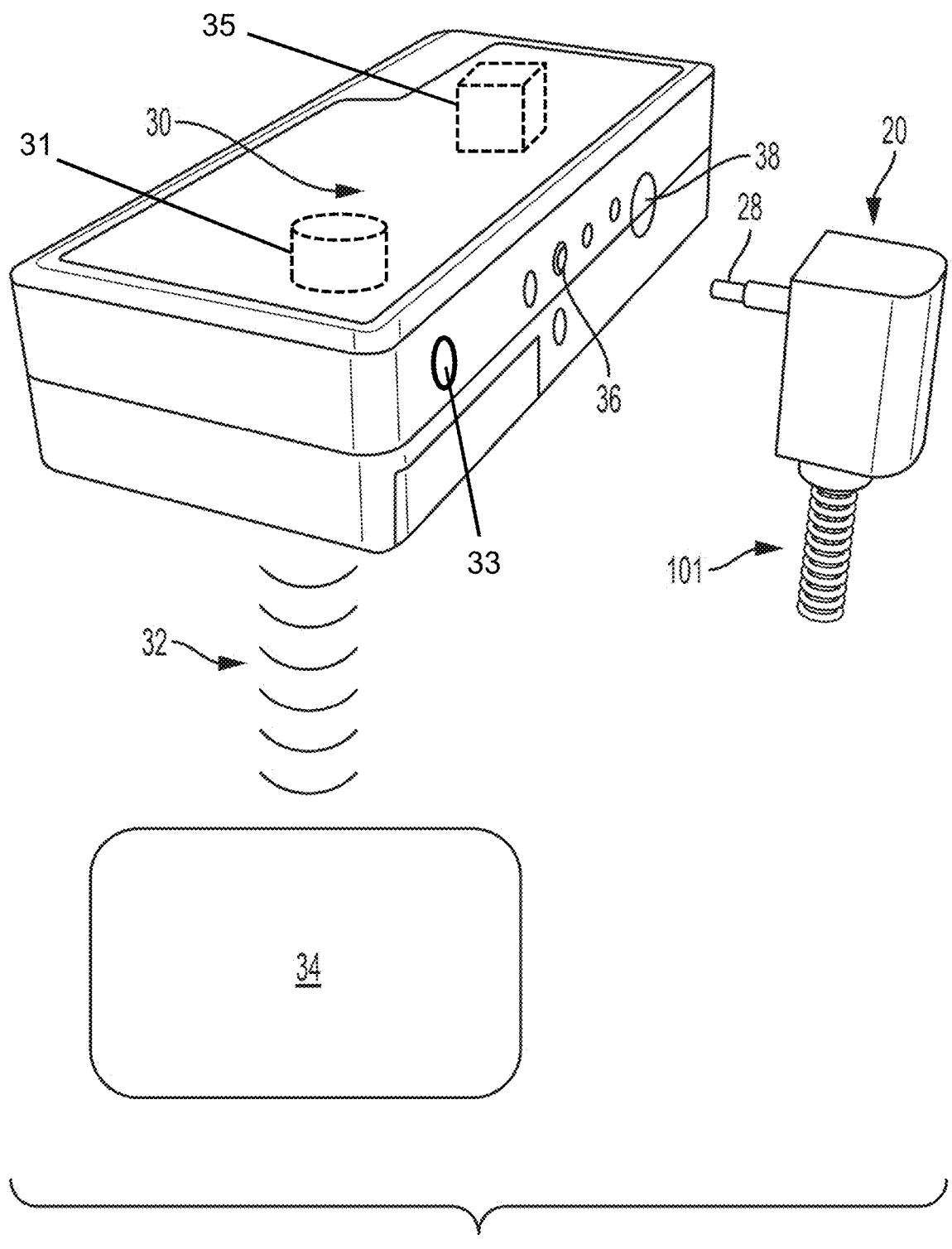
FIG. 3 shows an animal trap sensor in accordance with one embodiment of the present disclosure.

FIG. 3 shows animal trap sensor in accordance with one embodiment of the present disclosure. Animal trap sensor 20 may be adapted to electrically connect with signal unit 30 by plugging electrical conductor 28 of animal trap sensor 20 into electrical receptacle 36 of signal unit 30. In accordance with other embodiments of the present disclosure, sensor 20 may be adapted to connect with signal unit 30 via wire 58 (see, for example, FIGS. 4G, 4H, 5A-5C) or via wireless signals. Signal unit 30 may have reset switch 38 for resetting signal unit 30, alternatively the reset can be achieved remotely. When switch 101 is directly or indirectly triggered, e.g., oscillated or hit, that, in turn, causes the first metallic element 14 to contact the second metallic element 15, thereby forming a closed circuit, such that signal unit 30 transmits signal 32 to off-site receiver 34 to register or report a capture event.

For live traps, e.g., multi-catch traps, humane animal traps, or wildlife traps, animal trap sensor 20 may be used for a once and done detection. Even if animals in live traps continue to close electric circuit after the initial capture or if more animals got caught, off-site receiver 36 may have software to ignore all subsequent capture events. Thus, in another embodiment of the present disclosure, off-site receiver 36 may be configured not to register or report subsequent capture events after the initial capture event was registered, even if off-site receiver 36 continues to receive subsequent signals from signal unit 30. Off-site receiver 36 may be further configured to resume registering or reporting subsequent capture events when signal unit 30 is reset using reset switch 38.

FIG. 3 shows that signal unit 30 may include a test mode control mechanism 31 for initiating a test mode using test mode button 33. When triggering test mode, e.g., by depressing test mode button 33 or similar element, e.g., reset switch 38, on the side of the signal unit 30 or during set up or during routine maintenance, this may send a test mode signal via signal unit 30, e.g., LORA. Test mode button 33 and reset switch 38 may be the same unique button for initiating test mode and reset. Test signal may be processed and segregated from historical data so that test signal may not count as a capture event to indicate an actual animal capture. For example, when test mode is initiated and switch 101 is triggered, i.e., the first metallic element contacts the second metallic element, if off-site receiver 34 receives signal 32 to register a capture event, this may indicate that animal sensor 20 from "end-to-end" including from sensor 20 to cloud computation, e.g., transmitting wireless signal 32 and registering signal 32 in off-site receiver 34, may be operational. On the other hand, if off-site receiver 34 does not receive signal 32, this may indicate that animal sensor 20 including from sensor 20 to cloud computation, e.g., transmitting wireless signal 32 and registering signal 32 as capture event in off-site receiver 34, may not be operational. Thus, test mode operation may allow operators to identify potential problems and resolve them to ensure sensor 20 and/or signal unit 30 are operational when setting up sensor 20 in animal trap. Each attempt to resolve problems may be checked by triggering switch 101 in test mode. For example, successful resolution of problems may be indicated by off-site receiver 34 receiving signal 32 to register a capture event. This capture event may be flagged as "in test mode," so that off-site receiver 34 may not count this registered capture event "in test mode" as a real capture event, e.g., to be used in trend analysis for predicting future capture events.

FIG. 3 shows that signal unit 30 may include accelerometer 35 that measures acceleration in one or more axes of sensor 20, e.g., two- or three-axis accelerometer. If sensor 20 and/or signal unit 30 is jostled or moved, accelerometer 35 may detect rapid movement that causes acceleration to exceed a pre-set acceleration threshold value. Sensor 20 and/or signal unit 30 may subsequently provide a move signal to off-site receiver 34 to indicate sensor 20 and/or signal unit 30 may have been moved and, thus, may not be operational. In other words, move signal can be used to alert user that the trap might not be in good operating conditions anymore, e.g., moved from the desired location, e.g. not adjacent to wall anymore, but in middle of room. In addition, when off-site receiver 34 receives both move signal and capture signal within temporal proximity, e.g., within 1 second, 2 seconds, 5 seconds, or 10 seconds, between each other, the registered capture event may be treated as a false positive. Off-site receiver 34 may not count this false positive as a real capture for the purpose of trending capture event because sensor 20 and/or signal unit 30 was just moved or jostled and was not really triggered by animals so that no capture data would be recorded. Test mode control mechanism 31 and accelerometer 35 may be disposed together in the same signal unit 30 and/or sensor 20. Alternatively, test mode control mechanism 31 and accelerometer 35 may be disposed separately in different signal units and/or sensors.

For bait stations, e.g., perimeter bait stations (not with snap traps), although users may know when animals are feeding and no urgent need to check feeding event on-site, subsequent feeding events or hits, however, may be useful as a measure of animal activity, e.g., for counting animals coming to feed on toxic baits or to indicate when it is time to refill the bait. Thus, in yet another embodiment of the present disclosure, off-site receiver 34 may be configured to continue receiving subsequent signals from signal unit 30 and registering or reporting subsequent feeding events or hits after the initial one was registered.

Embodiments of the present disclosure also include animal trap systems containing animal traps and animal trap sensors for monitoring trap status.

Figure 4A:
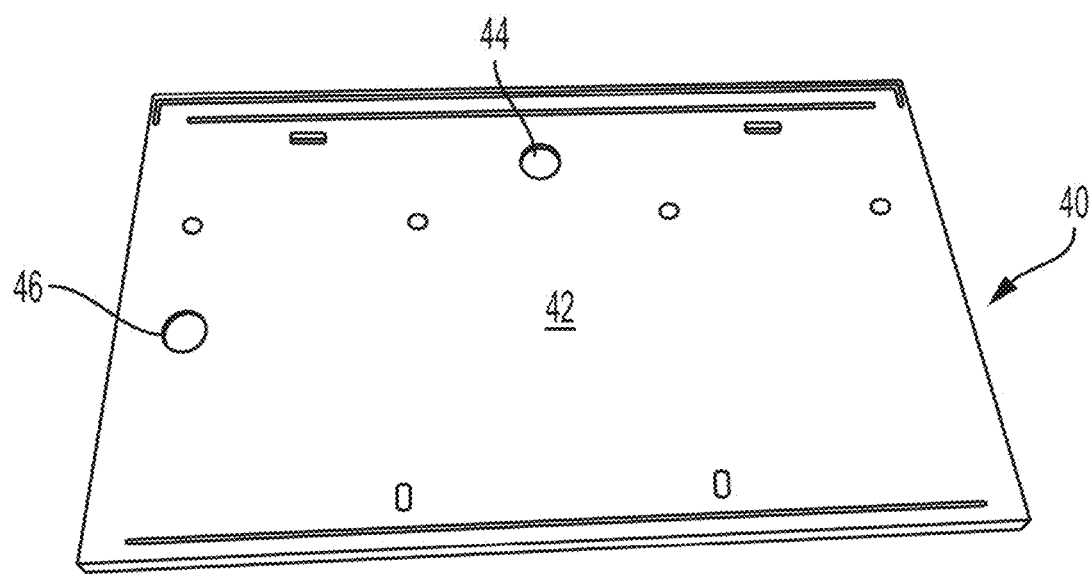
FIG. 4A shows an animal trap in accordance with one embodiment of the present disclosure.

FIG. 4A shows animal trap 40, e.g., tilt ramp trap, may have a movable cover 42, which may have at least one hole 44, 46, adapted for inserting switch 101 of animal trap sensor 20 into inner chamber of trap 40.

Figure 4B:
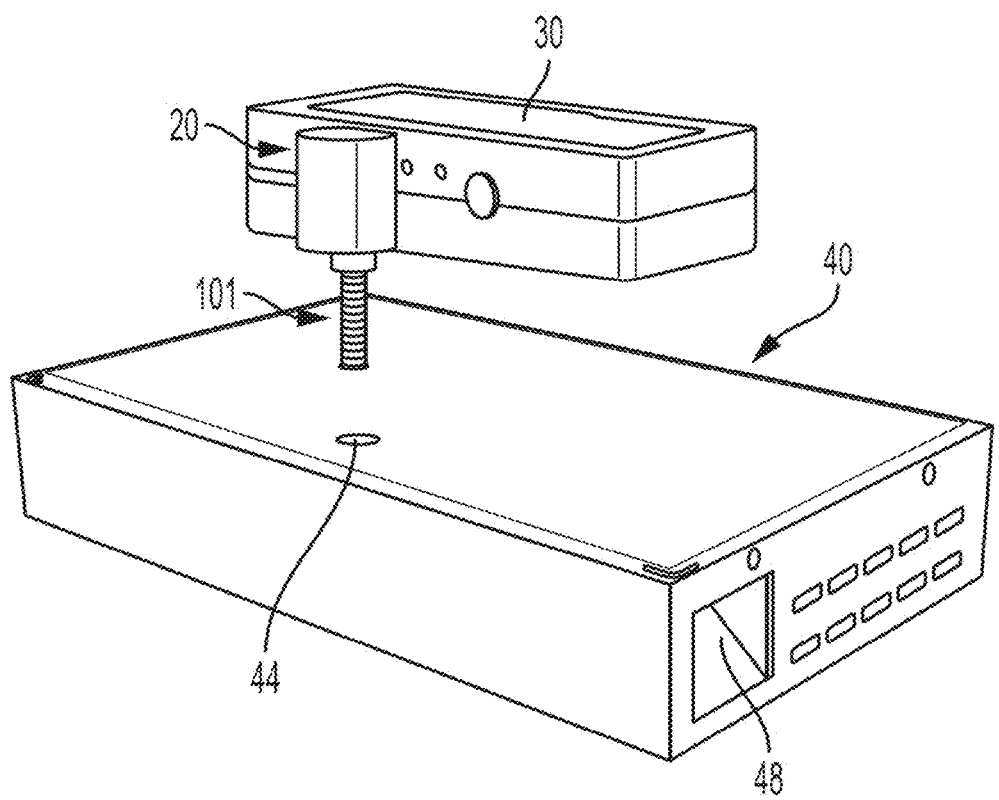
FIGS. 4B-4J show use of an animal trap system in accordance with other embodiments of the present disclosure.
Figure 4C:
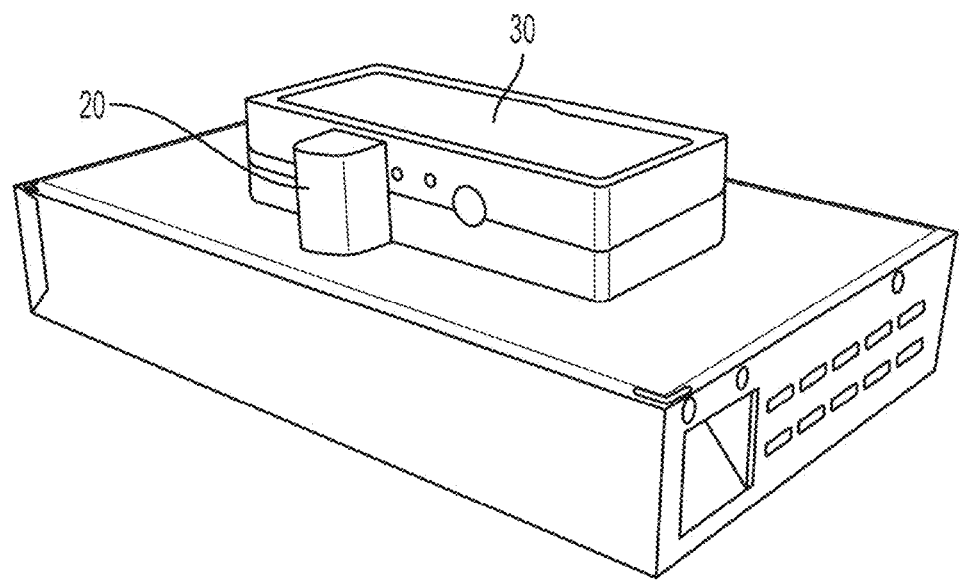

FIGS. 4B and 4C show an assembly of animal trap sensor 20 electrically connected with signal unit 30 before (FIG. 4B) and after (FIG. 4C) switch 101 is inserted into inner chamber of trap 40 through hole 44. Hole 44 is located above and along a passage leading from entrance 48, where animals enter trap 40. Once animals passing through entrance 48, it is expected that animals would directly or indirectly trigger, e.g., hit or oscillate, switch 101 causing the first metallic element 14 to contact the second metallic element 15, thereby forming a closed circuit, such that signal unit 30 transmits signals to off-site receiver to register or report capture event.

Figure 4D:
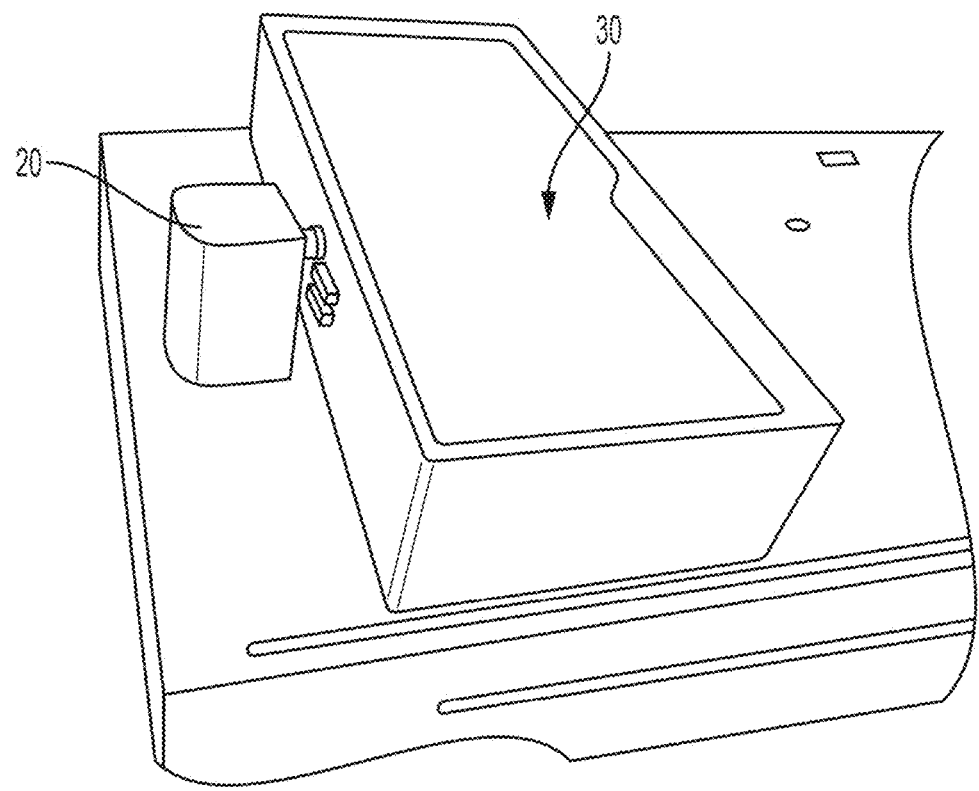
Figure 4E:
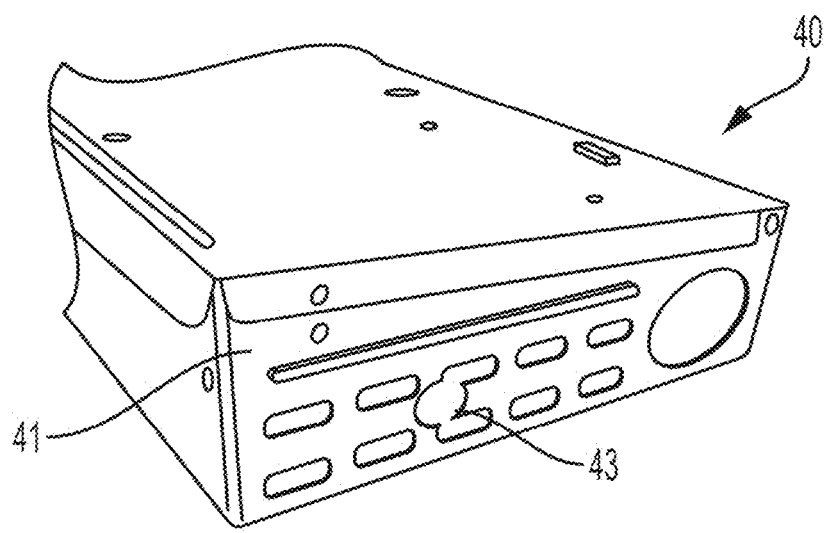
Figure 4F:
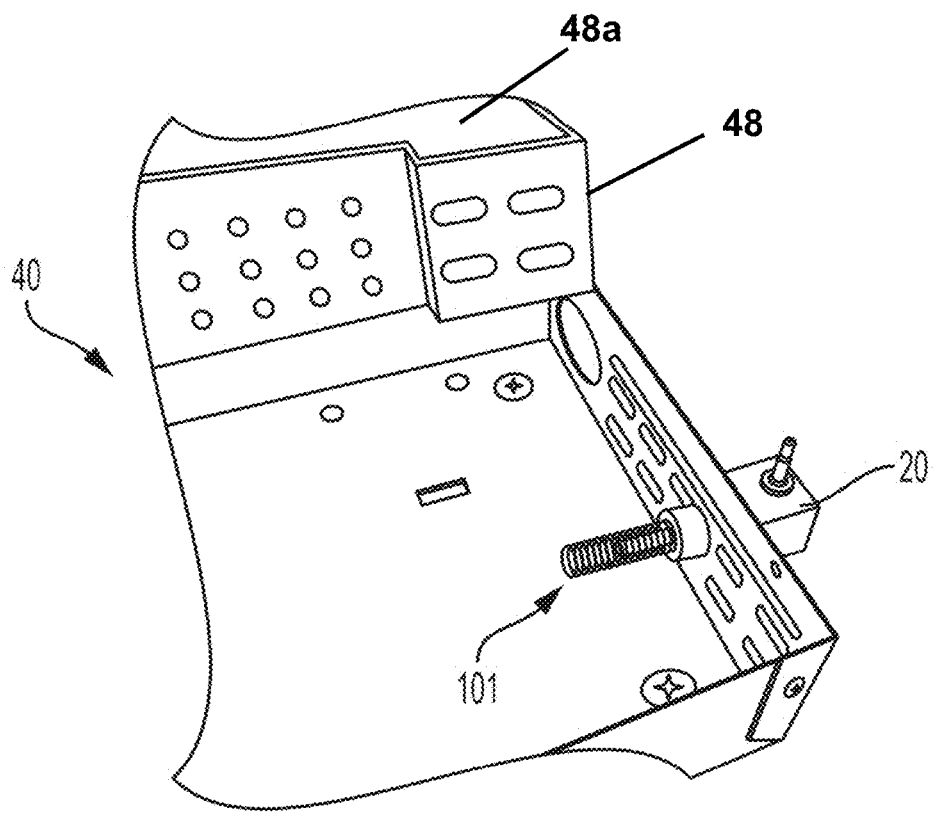

As described above, metallic elements 14, 15 and metallic tongues 102, 103 may be sheathed to eliminate false negatives. In case switch 101 positioned in the path of animal entry might deter animals from entering trap 40, as shown in FIG. 4D, switch 101 may be inserted into inside inner chamber of trap 40 through hole 46 (see FIG. 4A) or hole 43 (FIG. 4E) on side wall 41. Thus, once animals entered trap 40, it is expected that animals would directly or indirectly trigger, e.g., hit or oscillate, switch 101 (FIG. 4F) causing the first metallic element 14 to contact the second metallic element 15, thereby forming a closed circuit, such that signal unit 30 transmits signals to off-site receiver to register or report capture event.

Figure 4G:
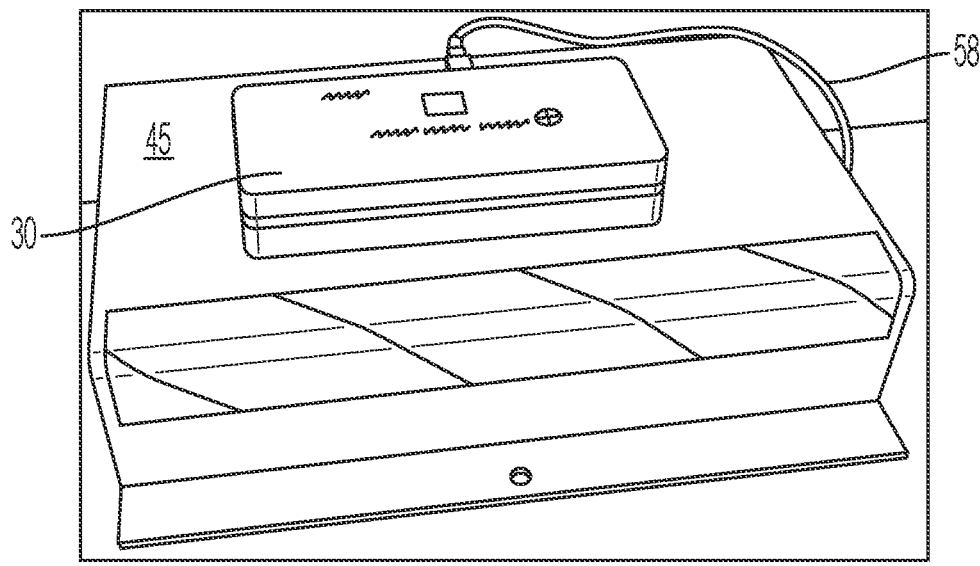
Figure 4H:
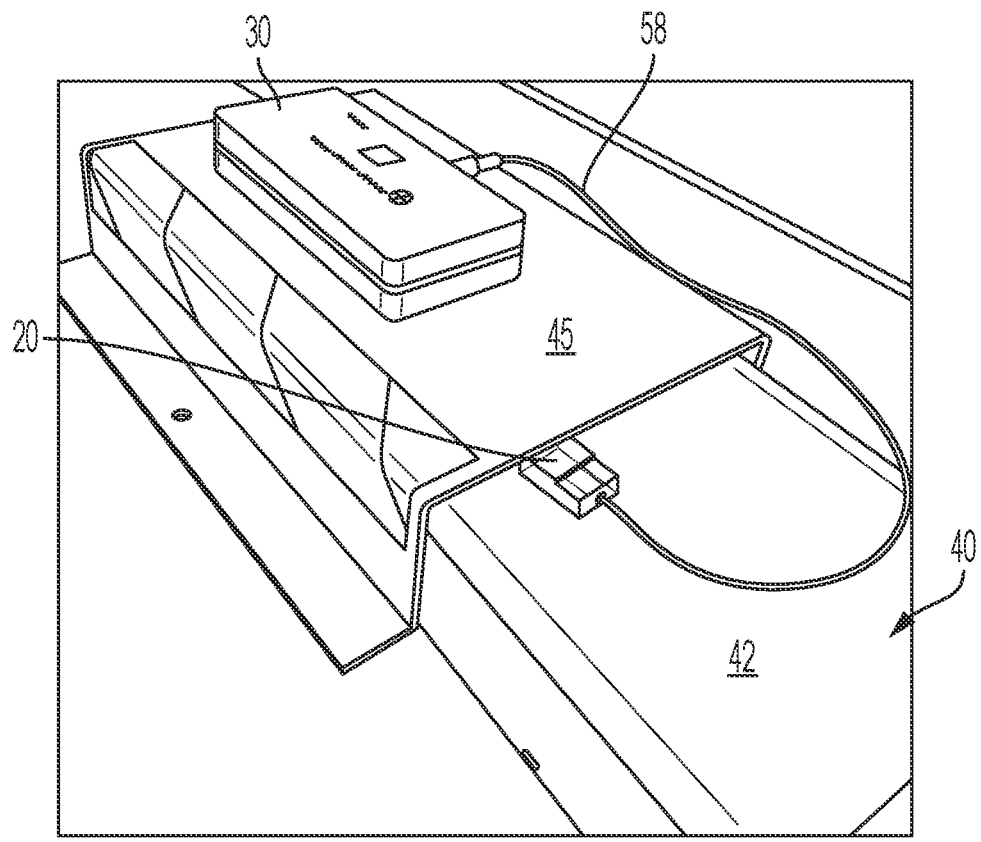
Figure 4I:
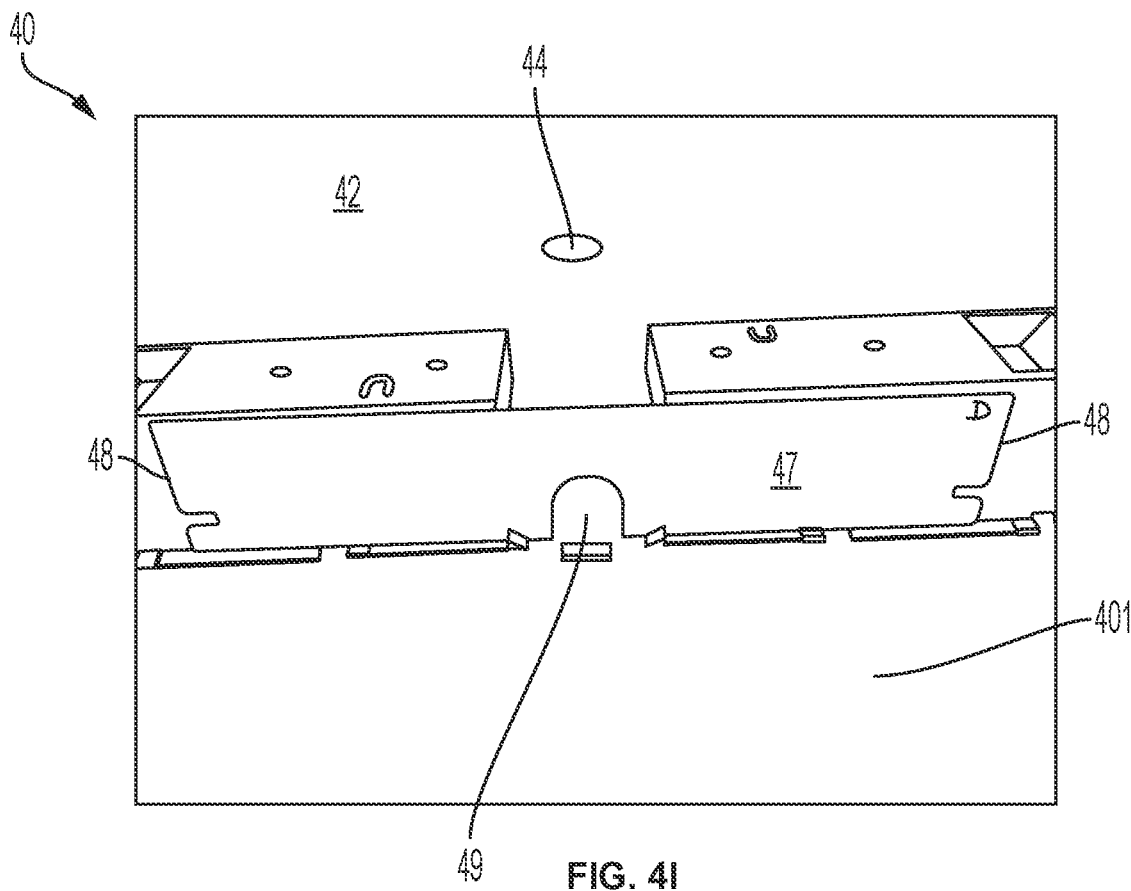

FIG. 4I shows, to ensure that animals, e.g., mouse, of all sizes would be detected in trap 40, such as tin cat style trap, trap 40 may have divider 47 disposed inside trap 40 between main chamber 401 inside trap 40 and trap entrance 48. Divider 47 may have at least one opening 49 leading to main chamber 401. Switch (not shown) may be inserted inside trap 40 through hole 44 and disposed between opening 49 and trap entrance 48, such that animals entering main chamber 401 through opening 49 will cause the first metallic element to contact the second metallic element, thereby forming a closed circuit, such that signal unit transmits signal to off-site receiver.

Figure 4J:
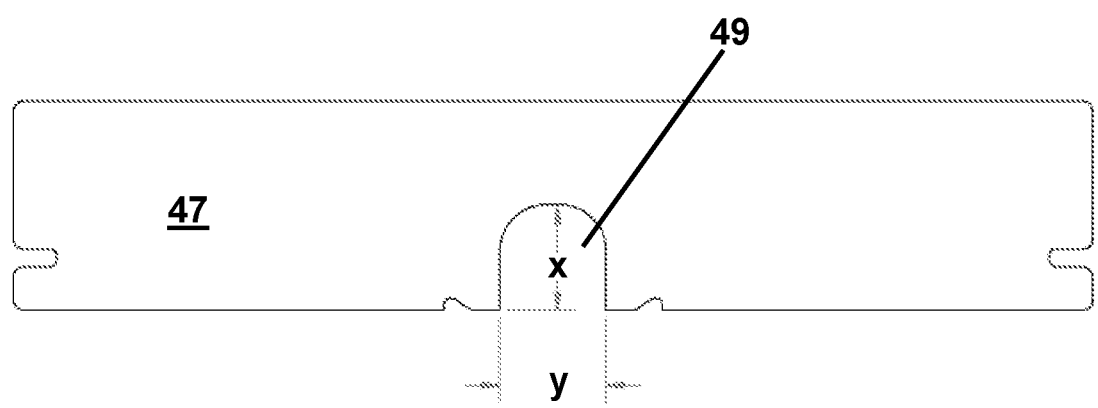

FIG. 4J shows opening 49 of divider 47 may have any suitable dimensions, e.g., height (x) and width (y), that would allow animals, such as mouse, of all sizes to pass through opening 49. For example, opening 49 may have a height of from 15 mm to 25 mm and a width of from 15 mm to 30 mm, preferably, from 18 mm to 22.5 mm (e.g., 18.225 mm, 19.225 mm, 20.225 mm, 21.225 mm, and 22.225 mm) in height and from 17 mm to 25.5 mm (e.g., 17.4 mm, 19.4 mm, 21.4 mm, 23.4 mm, and 25.4 mm) in width. Divider 47 may be integral part or removable part of trap and may be made of any suitable materials, e.g., plastics, papers, fabrics, and/or metals, etc. As removable part, divider 47 may be disposed inside trap using any suitable fastener, e.g., nails, screws, pins, glues, pastes, Velcro snaps, magnets, etc. Divider 47 itself may be made of magnetized materials and may be directly attached to metal trap entrance.

Configurations shown FIGS. 4B-4F may also be applicable to bait stations such that feeding events (or hits) may be monitored when animals inside bait stations directly or indirectly trigger, e.g., oscillate or hit, switch 101 causing the first metallic element 14 to contact the second metallic element 15, thereby forming a closed circuit, such that signal unit 30 transmits signals to off-site receiver 34 to register or report hits or feeding events.

Figure 5A:
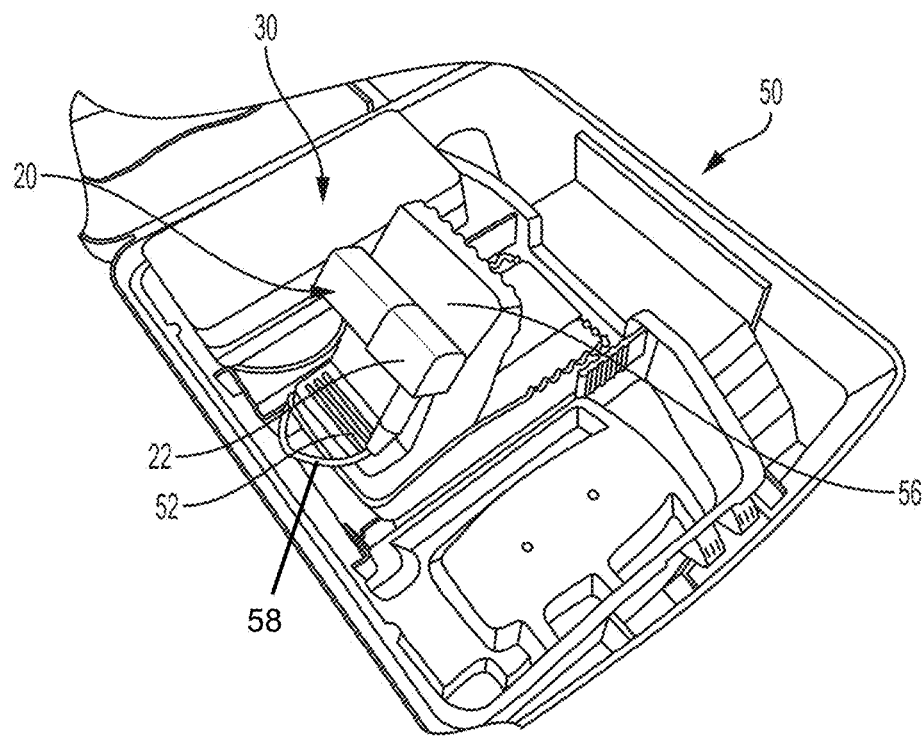
FIGS. 5A-5C show an animal trap system in accordance with other embodiments of the present disclosure.
Figure 5B:
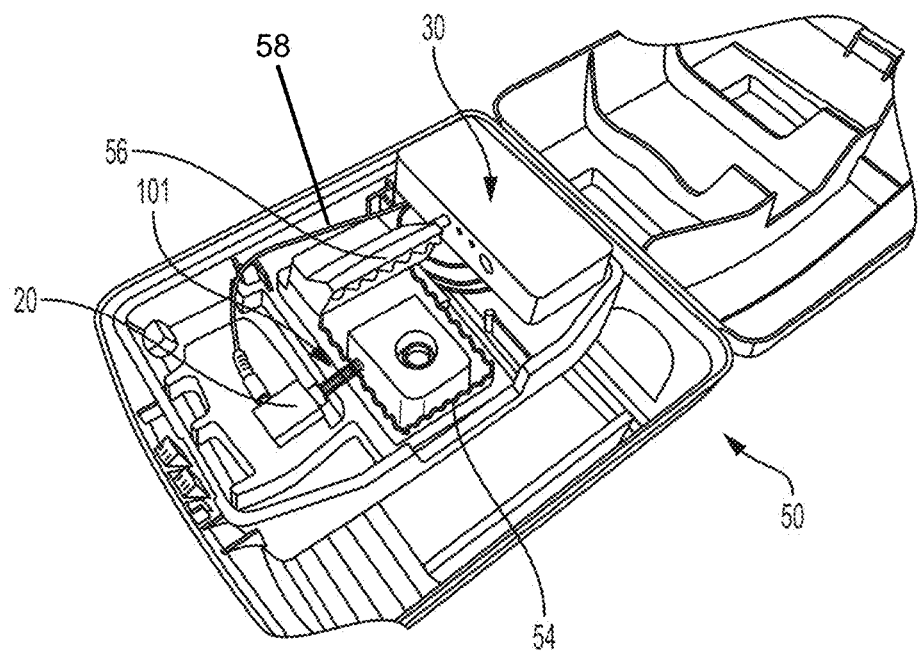
Figure 5C:
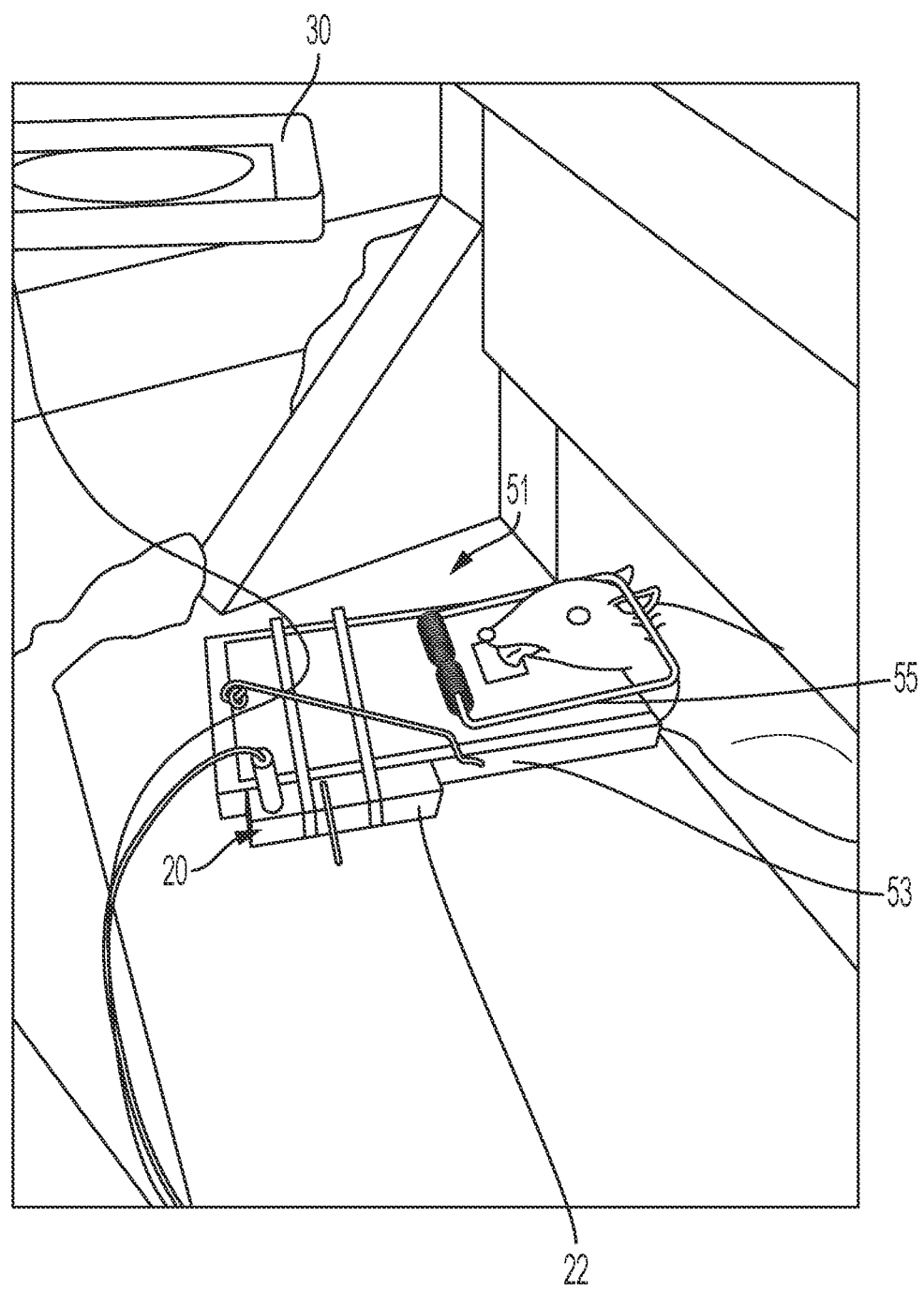

FIGS. 4C and 4D show sensor switch may be attached directly to signal unit 30, e.g., LORA signal processor, which sits on top of trap. However, as shown in FIGS. 4G and 4H, for certain applications, extra cover 45 may be needed to cover over trap 40, e.g., tin cat style trap. In these applications, extra cover 45 would be blocked by signal unit 30, e.g., LORA signal processor, sitting on top of trap 40. To address this issue, FIGS. 4G and 4H show trembler switch (not shown), which is part of sensor 20 and is inserted into trap 40 through a hole on top 42 of trap 40, may be connected with signal unit 30, e.g., LORA signal processor, via wire 58 or wireless signals so that signal unit 30 can now sit on top of extra cover 45 that enclose trap 40. FIGS. 5A, 5B, and 5C show other examples that sensor 20 and signal unit 30 may be connected with wire 58 or wireless signals. These configurations may allow sensor 20 and signal unit 30 to be detachably disposed and electrically connected to each other anywhere in traps, which may include tilt-ramp trap, snap trap, and wildlife trap, to register capture event.

Embodiments of the present disclosure may also include multiple trembler switches (e.g., 1-20, preferably at least 2, at least 5, or at least 10) located in multiple bait stations (e.g., at least 2, at least 5, or at least 10) or multiple traps (e.g., 1-20, preferably at least 2, at least 5, or at least 10) to connect with a single signal unit 30, e.g., LORA signal processor, via multiple wires (e.g., 1-20, preferably at least 2, at least 5, or at least 10) or via wireless signals.

Embodiments of the present disclosure may also include trembler switch connected to a mouse trap device that may be triggered by vibration caused by the animal, i.e., without direct contact with trembler switch by animals, when capture is made, to closing electrical circuit and recording capture signal.

Figure 8A:
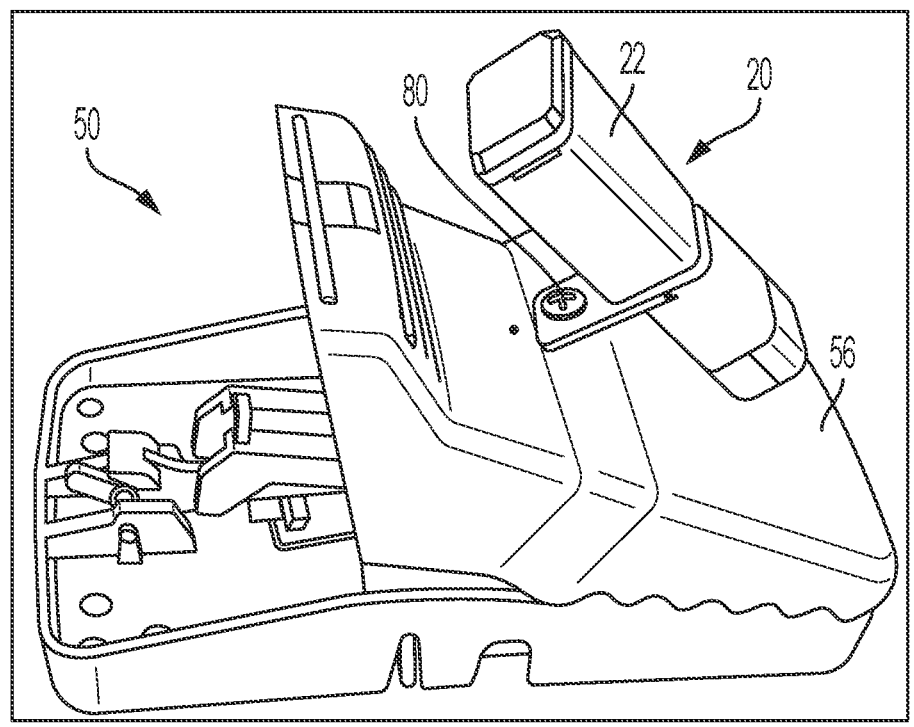
FIGS. 8A and 8B show an animal trap system in accordance with other embodiments of the present disclosure.
Figure 8B:
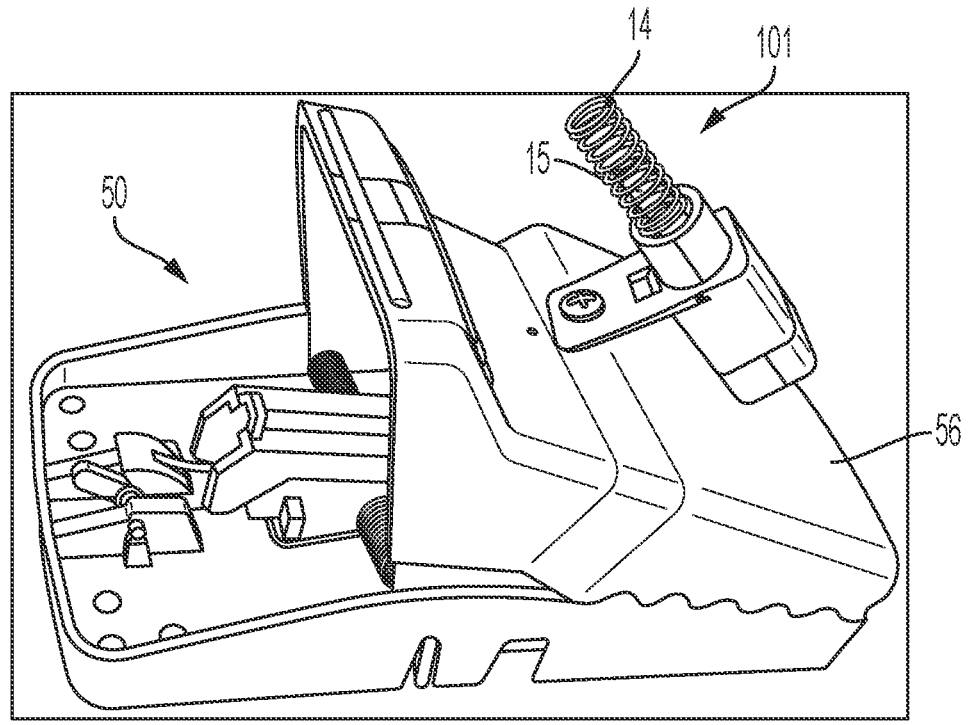

FIG. 5A and FIG. 8A show switch 101 (not shown) enclosed in housing 22 of sensor 20, which may be connected with signal unit 30, e.g., LORA signal processor, via wire 58 or wireless signals, may be mounted unto upper jaw 56 of spring-loaded trap 50, e.g., snap trap. FIG. 8A shows the sensor 20 may be mounted unto upper jaw 56 of spring-loaded trap, e.g., snap trap, via any suitable means, such as a screw 80. When trap 50 is tripped or snapped, through the vibrational force of trap snapping, the first metallic element 14 and the second metallic element 15 are brought into contact, thereby forming a closed circuit, such that signal unit 30 transmits signals to off-site receiver 34 to register or report capture event. Such configurations of trap sensor system for transmitting signals to off-site receiver 34 can also be accomplished using switch 101 without housing 22. For example, FIG. 8B shows switch 101 without being enclosed by housing 22 may be similarly mounted unto upper jaw 56 of spring-loaded trap, as shown in FIG. 8A. Similarly, when trap 50 is tripped or snapped, through the vibrational force of trap snapping, the first metallic element 14 and the second metallic element 15 are brought into contact, thereby forming a closed circuit, such that signal unit 30 transmits signals to off-site receiver 34 to register or report capture event.

Alternatively, as shown in FIG. 5B, switch 101 may be positioned on lower jaw 54 of trap 50 such that, when trap 50 is tripped, lower jaw 54 snaps against upper jaw 56. Such motion may directly or indirectly trigger, e.g., hit and oscillate, switch 101 causing the first metallic element 14 to contact the second metallic element 15, thereby forming a closed circuit, such that signal unit 30 transmits signals to off-site receiver 34. Such configurations of trap sensor system for transmitting signals to off-site receiver can also be accomplished by attaching switch 101 to upper jaw 56. Thus, when trap 50 is tripped, upper jaw 56 attached with switch 101 snaps against lower jaw 54 causing the first metallic element 14 to contact the second metallic element 15, thereby forming a closed circuit.

FIG. 5C shows switch 101 (not shown) enclosed in housing 22 of sensor 20, which may be connected with signal unit 30, e.g., LORA signal processor, via wire 58 or wireless signals, may be attached to bottom portion 53 of spring-loaded trap 51 by any suitable means, e.g., ties, strings, glues, screws, nails, tapes, VELCRO sticky backs, etc., such that, when trap 51 is tripped, spring 55 snaps against bottom portion 53. Such motion may trigger, e.g., hit and oscillate, switch 101 causing the first metallic element 14 to contact the second metallic element 15, thereby forming a closed circuit, such that signal unit 30 transmits signals to off-site receiver 34.

Figure 6:
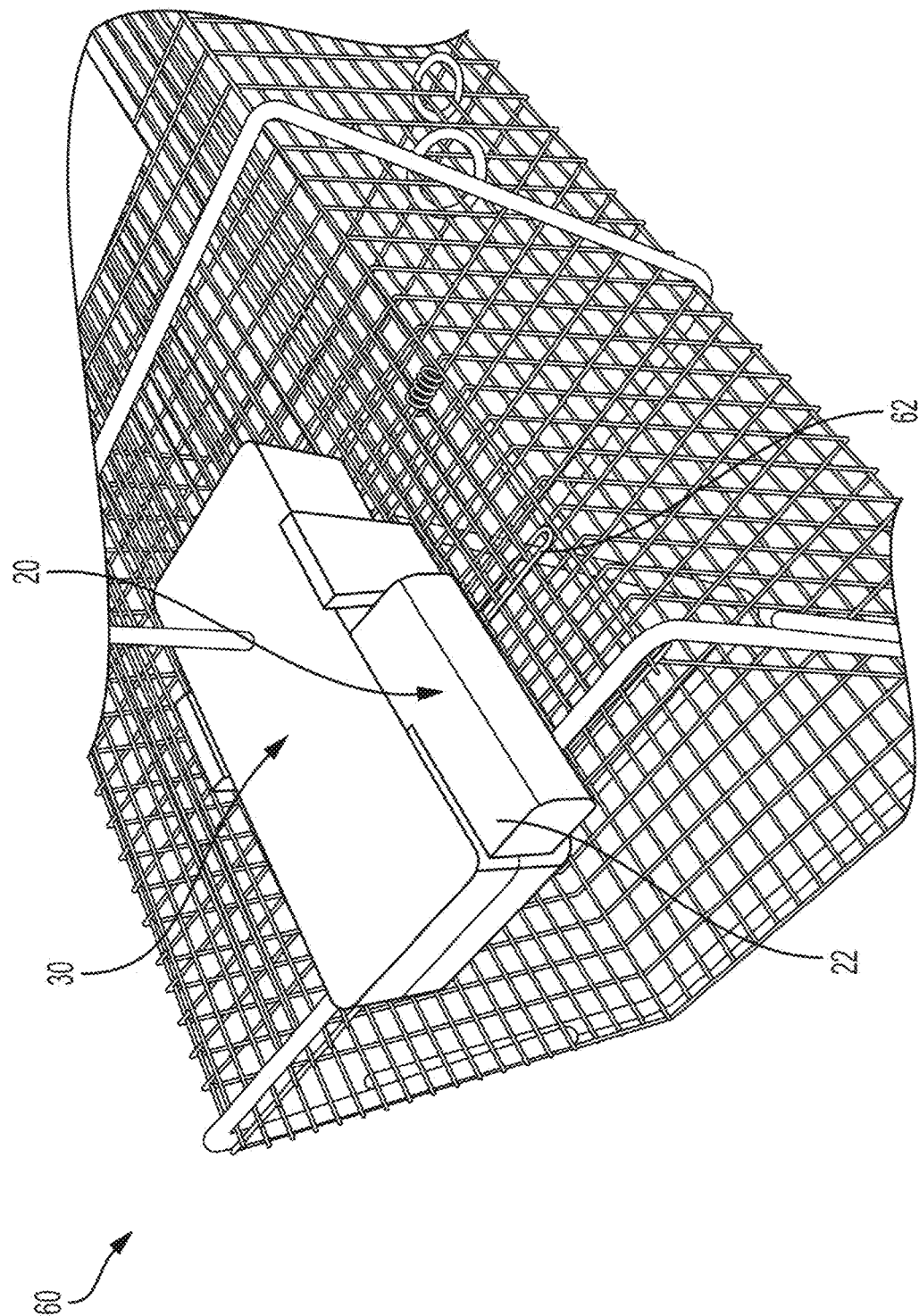
FIG. 6 shows an animal trap system in accordance with another embodiment of the present disclosure.

FIG. 6 shows switch 101 (not shown) enclosed in housing 22 may be positioned near trap door 62 of live trap 60, e.g., wildlife traps, such that, when trap 60 is tripped, movement of closing trap door 62 forcibly vibrate housing 22, thus, directly or indirectly triggering, e.g., oscillating or hitting, switch 101 inside housing 22, causing the first metallic element 14 to contact the second metallic element 15, thereby forming a closed circuit, such that signal unit 30 transmits signals to off-site receiver 34 to register or report capture event. Such configurations of trap sensor system for transmitting signals to off-site receiver can also be accomplished by using switch 101 without housing 22.

In case of metal traps, e.g., tin traps, the first metallic element of switch 101 may be part of trap itself (stirrup of snap trap), e.g. pole Minus. The second metallic element, e.g., pole Positive, of switch 101 may or may not be part of trap itself but can be mounted on traps and have any suitable shape, e.g., tongue, plate, rod, cone, or spring. For example, similar to FIGS. 1G and 1H, animals may contact metal trap causing the first metallic element 102, e.g., stirrup of snap trap, to contact the second metallic element 103, e.g., spring, thereby forming a closed circuit.

Figure 7:
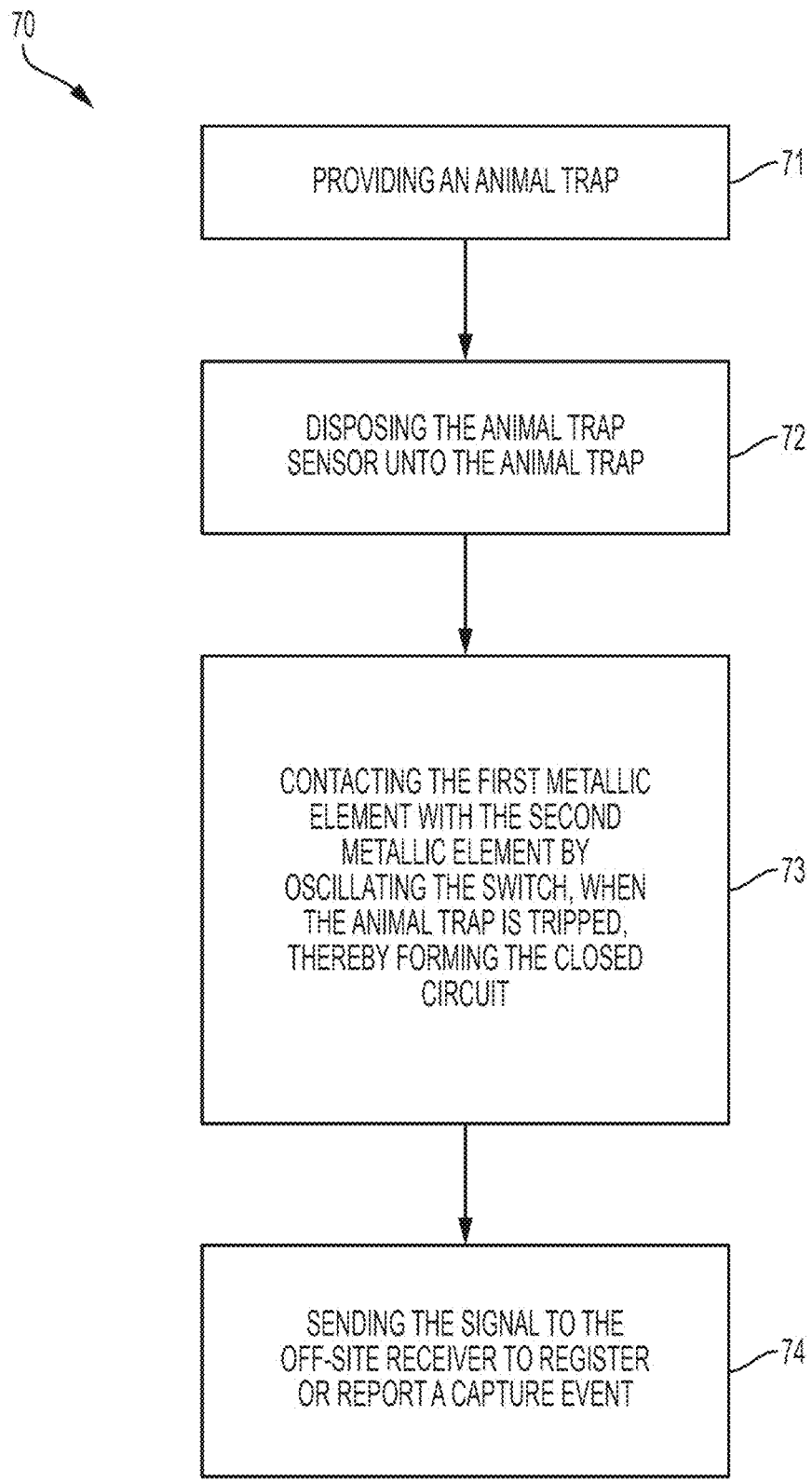
FIG. 7 shows a method in accordance with one embodiment of the present disclosure.

FIG. 7 shows a method 70 for trapping animals including providing animal trap (71), e.g., live traps (e.g., tilt-ramp traps and wildlife traps) and spring-loaded traps (e.g., snap traps); disposing animal trap sensor unto animal trap (72), contacting the first metallic element with the second metallic element by directly or indirectly triggering, e.g., oscillating, switch (73), when the animal trap is tripped, thereby forming the closed circuit, and sending signals to off-site receiver to register or report a capture event (74). Such methods for transmitting signals to off-site receiver may also be applicable to registering and measuring frequency of feeding events or hits in bait stations.

Figure 9:
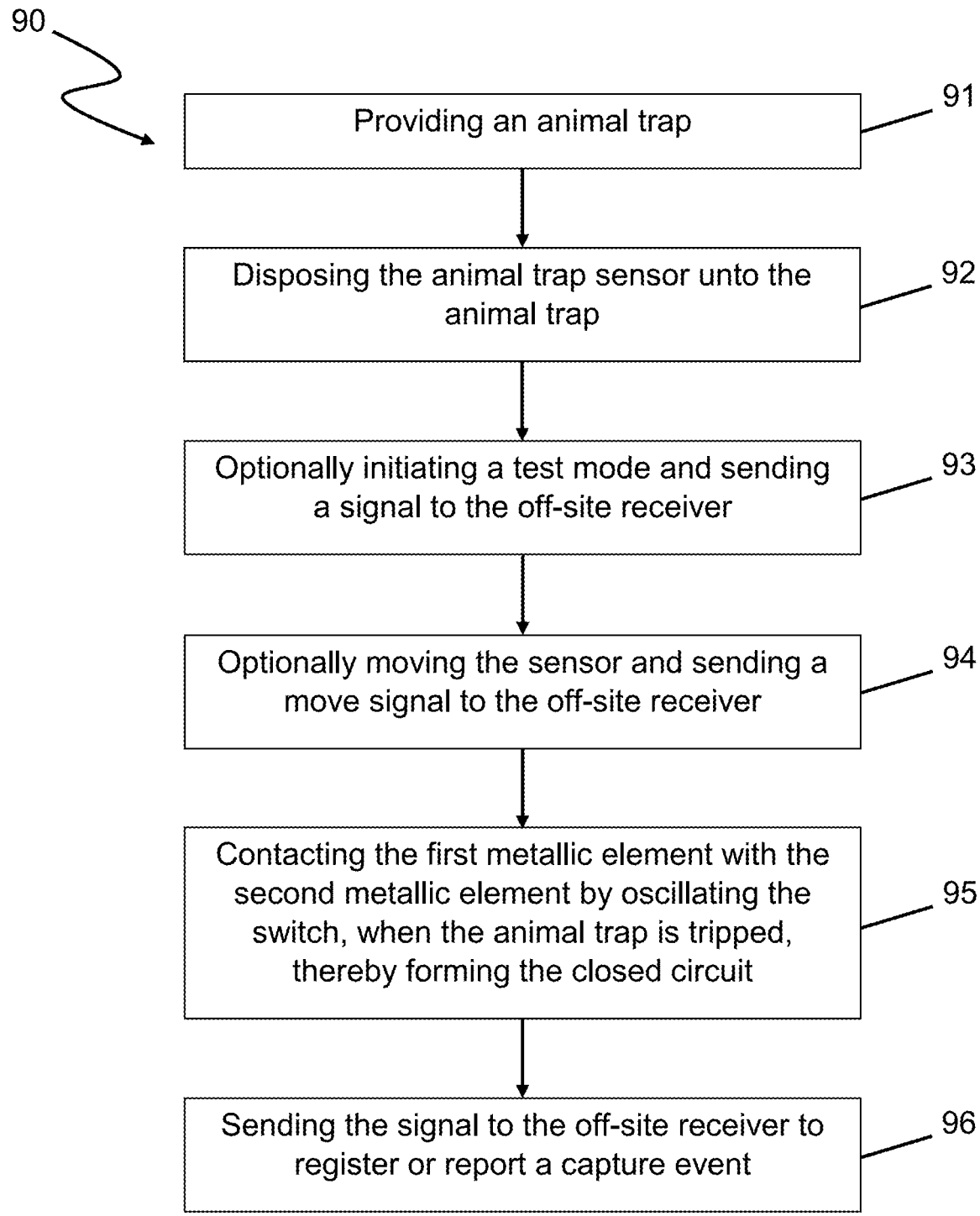
FIG. 9 shows a method in accordance with other embodiment of the present disclosure.

FIG. 9 shows a method 90 for trapping animals including providing animal trap (91), e.g., live traps (e.g., tilt-ramp traps and wildlife traps) and spring-loaded traps (e.g., snap traps); disposing animal trap sensor onto animal trap (92); optionally initiating a test mode and sending a signal to the off-site receiver (93), in which, when test mode is initiated, if off-site receiver receives the signal to register a capture event, this may indicate that the animal sensor is operational, on the other hand, if off-site receiver does not receive the signal, this may indicate that the animal sensor is not operational; optionally moving the sensor and sending a move signal to the off-site receiver (94), the move signal may indicate the sensor may be moved and, thus, may not be operational; contacting the first metallic element with the second metallic element by directly or indirectly triggering, e.g., oscillating, switch (95), when the animal trap is tripped, thereby forming the closed circuit; and sending signals to off-site receiver to register or report a capture event (96). Capture event registered in the test mode may be segregated from real capture event and may not be counted in historical capture events or may not be used in trend analysis for predicting future capture events. Initiating a test mode (93) may be performed at setting up trap or at performing a maintenance of trap. In addition, when off-site receiver receives the move signal and the signal within temporal proximity, e.g., within 1 second, 2 seconds, 5 seconds, or 10 seconds, between each other, the registered capture event may be treated as a false positive. Such methods for transmitting signals to off-site receiver may also be applicable to registering and measuring frequency of feeding events or hits in bait stations.

Figure 10:
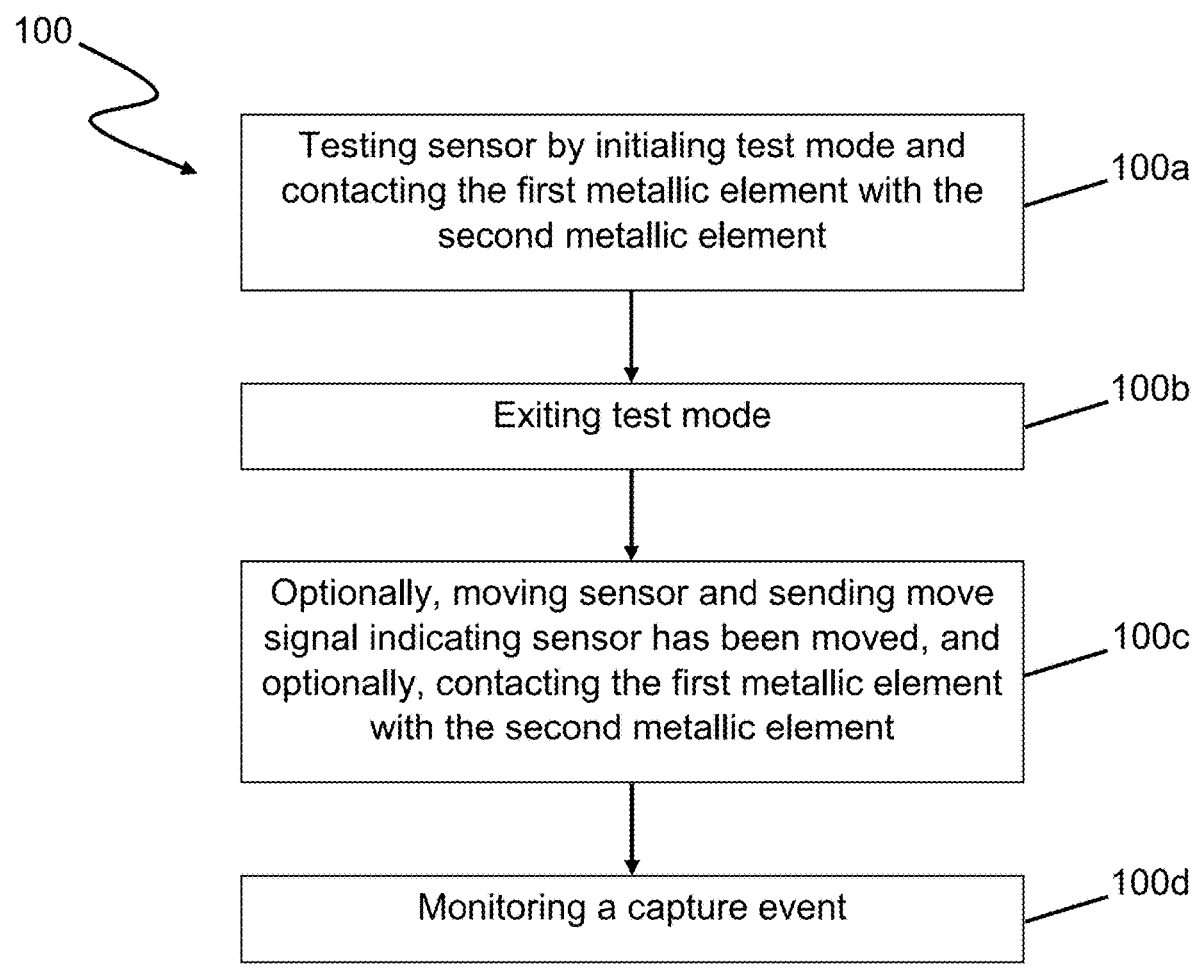
FIG. 10 shows a method in accordance with another embodiment of the present disclosure.

FIG. 10 shows a method 100 of monitoring an animal trap system using sensor in accordance with some embodiments of the invention may include steps of testing sensor (100a), which may include initialing test mode and contacting the first metallic element with the second metallic element, if off-site receiver receives signal to register a capture event, this indicates that animal sensor may be operational, and if off-site receiver does not receive the signal, this indicates that animal sensor may not be operational; exiting test mode (100b), optionally moving sensor and sending move signal indicating the sensor has been moved, e.g., moved from the desired location, e.g. not adjacent to wall anymore, but in middle of room, and optionally, contacting the first metallic element with the second metallic element (100c), and monitoring a capture event (100d). If off-site receiver receives move signal and signal to register a capture event within 10 seconds between each other, the signal (to register a capture event) is registered as a false positive. The capture event registered in the test mode may not be counted as a capture event in a trend analysis for predicting future capture event. Initiating test mode (100a) may be at setting up the trap or at performing a maintenance of the trap.

Figure 11A:
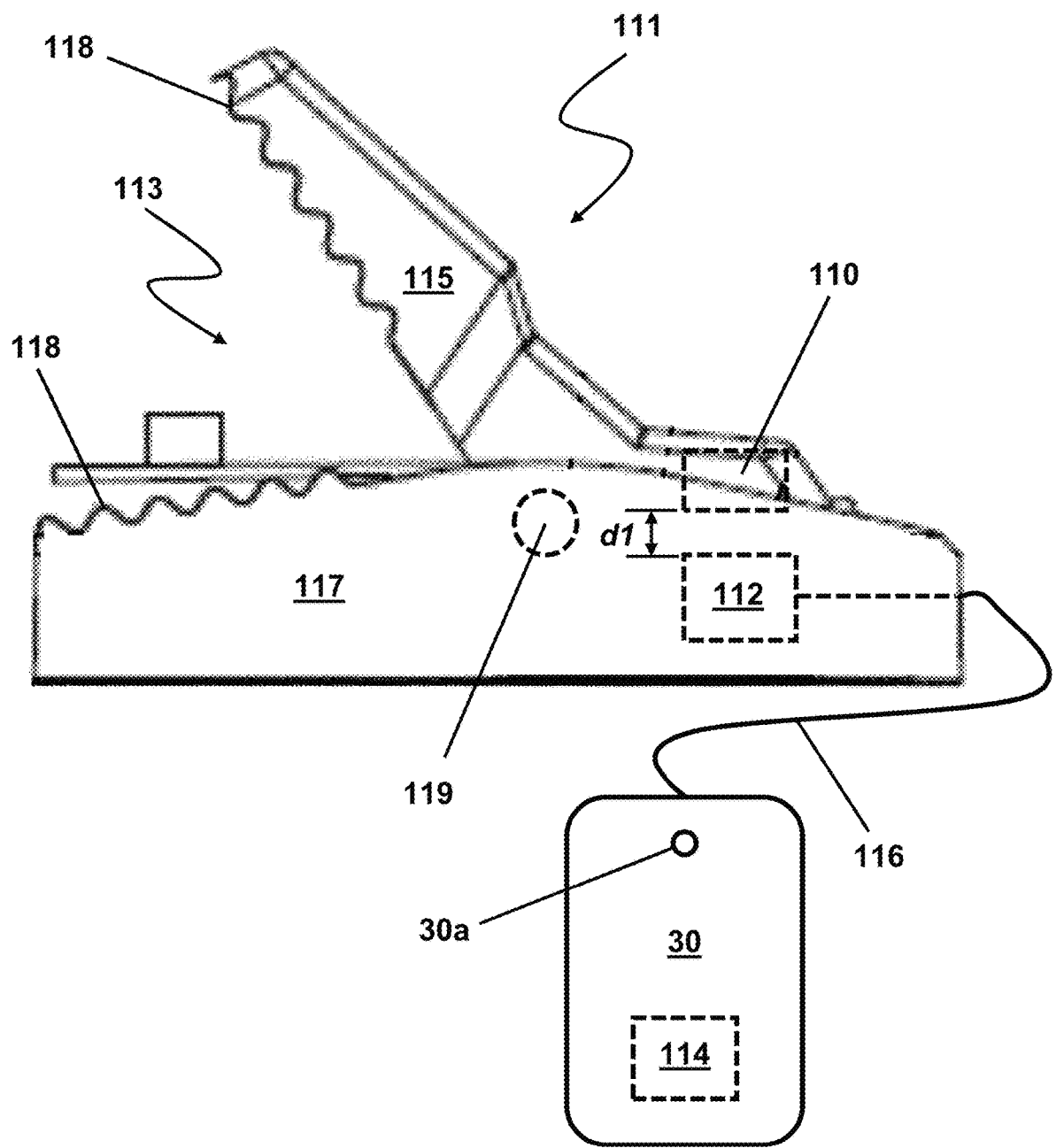
FIGS. 11A and 11B show an animal trap system in accordance with another embodiment of the present disclosure.
Figure 11B:
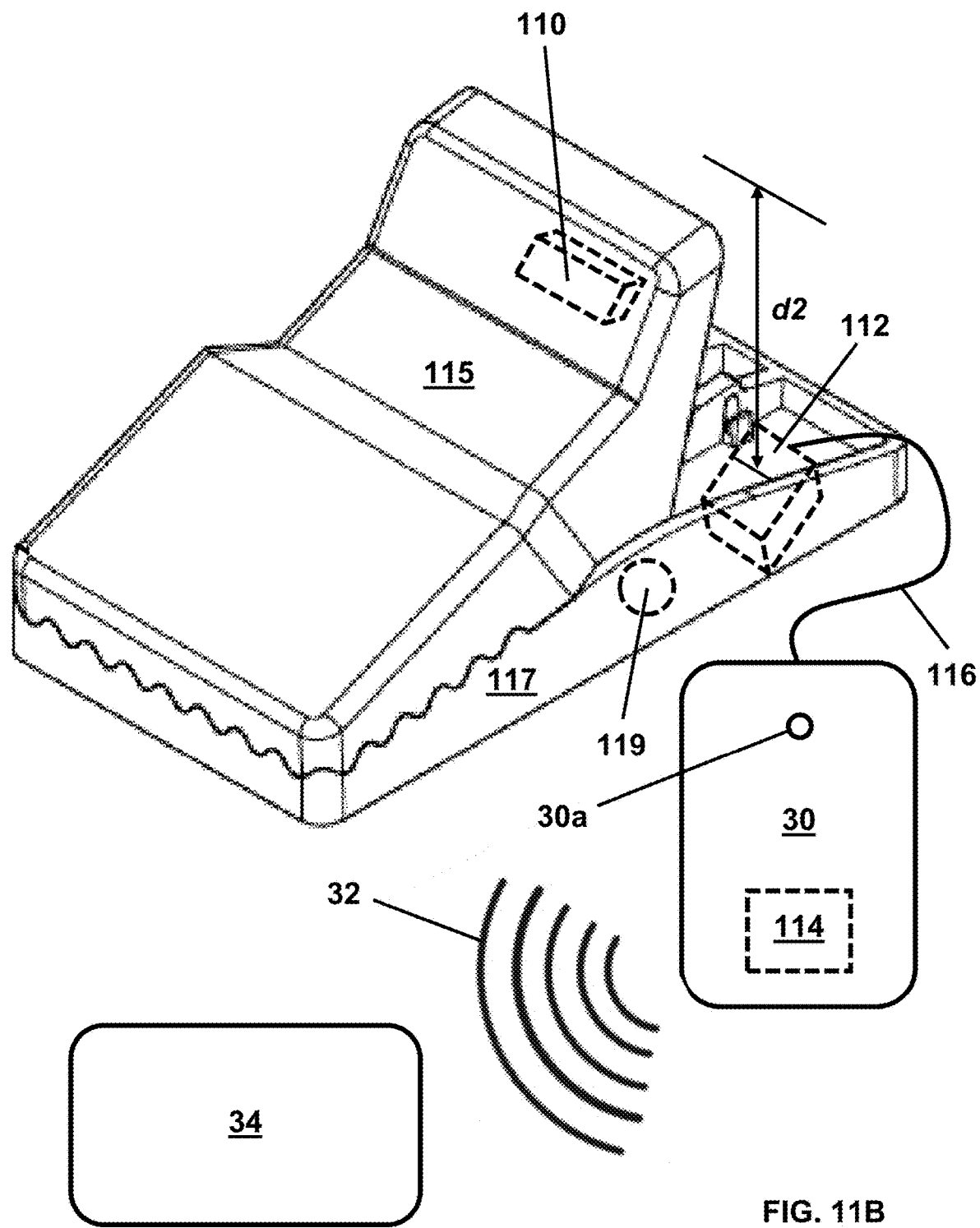

Embodiments of the present disclosure may also include animal trap sensors that can be activated by a change of distance between two portions in sensors. For example, FIG. 11A shows that an animal trap sensor may include a first portion 110 and a second portion 112 electrically connected, e.g., via electrical wires 116 and/or conductors, with signal unit 30 having power supply 114, e.g., battery and/or solar power. When the first portion 110 and the second portion 112 are disposed at a first distance d1 between each other, thereby generating an output property, e.g., voltages. FIG. 11B shows that, when the first portion 110 and the second portion 112 are disposed at a second distance d2 between each other, which is different from the first distance d1, thereby changing the output property and causing signal unit 30 to transmit signal 32, e.g., wired and/or wireless signal, to off-site receiver 34. When output property changes, an indicator 30a, e.g., LED light, in signal unit 30 may be turned on to indicate trap 113 is triggered, and signal 32, e.g., "trigger message," may be sent to off-site receiver 34. In one embodiment of the present disclosure, the first portion 110 may include magnet and the second portion 112 may include magnetically-responsive component, such as Hall effect sensor or magnetoresistor.

FIG. 11A shows an animal trap system 111 including an animal trap 113 and animal trap sensor that may include a first portion 110 and a second portion 112 electrically connected, e.g., via electrical wires 116 and/or conductors, with signal unit 30 having power supply 114, e.g., battery and/or solar power. Animal trap 113, e.g., spring-loaded traps, such as snap trap, may include moving portion 115, base 117, and internal spring mechanism 119 configured to urge moving portion 115 toward base 117. The first portion 110 of the sensor may be disposed in moving portion 115 and the second portion 112 of the sensor may be disposed in base 117. Alternatively, the first portion 110 of the sensor may be disposed in base 117 and the second portion 112 of the sensor may be disposed in moving portion 115. Although FIGS. 11A and 11B show that the first portion 110 and the second portion 112 of the sensor may be disposed at the proximal end of animal trap 113, the first portion 110 and the second portion 112 of sensor, however, may also be disposed at the distal end, which may include jaws 118.

FIG. 11A shows that animal trap 113 is armed, when the first portion 110 and the second portion 112 of the sensor are disposed at the first distance d1 between each other, thereby generating output property, e.g., voltage.

FIG. 11B shows animal trap 113 is triggered, when internal spring mechanism 119 urges moving portion 115 toward base 117, the first portion 110 and the second portion 112 of sensor are disposed at the second distance d2 between each other, which is different from the first distance d1, thereby changing the output property and causing signal unit 30 to transmit signal 32 to off-site receiver 34.

For example, the first portion 110 may include a magnet positioned on the moving upper portion 115 of snap trap 113 and the second portion 112 may include Hall effect sensor or magnetoresistor positioned on base 117 of trap 113. When trap 113 is armed, magnet 110 is at close proximity to Hall effect sensor 112, thereby generating a voltage. When trap 113 is triggered, magnet 110 moves away from Hall effect sensor 112, resulting in the second distance d2 being greater than the first distance d1 and absence or decrease of magnetic field. This, in turn, decreases the voltage in Hall effect sensor 112. When voltage decreases, indicator 30a, e.g., LED light, in signal unit 30 may be turned on to indicate trap 113 is triggered, and signal 32, e.g., "trigger message," may be sent to off-site receiver 34.

Figure 12:
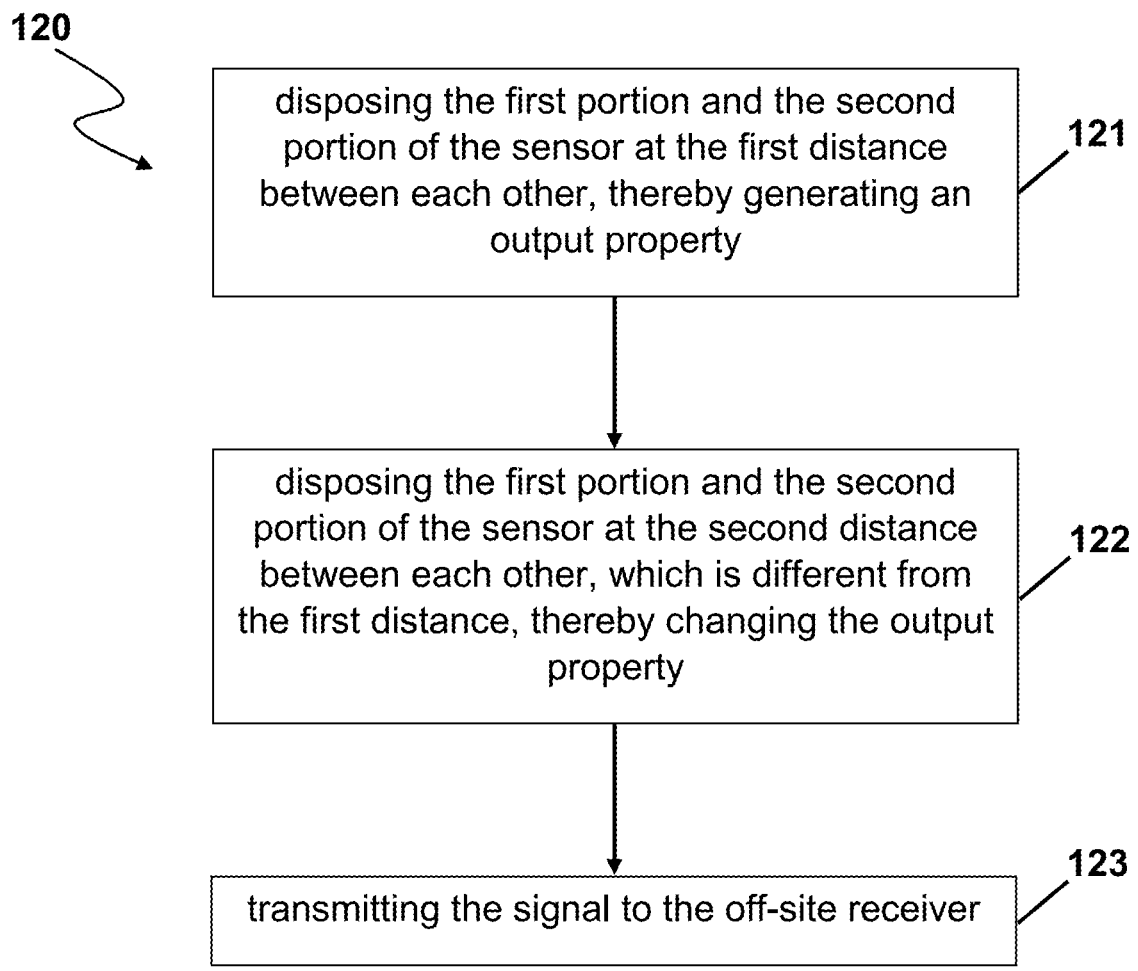
FIG. 12 shows a method in accordance with another embodiment of the present disclosure.

FIG. 12 shows a method 120 of monitoring the animal trap system, including disposing the first portion and the second portion of sensor at the first distance between each other, thereby generating output property (121), disposing the first portion and the second portion of sensor at the second distance between each other, which is different from the first distance, thereby changing the output property (122), and transmitting signal to off-site receiver (123).

Advantages of the present disclosure may include a single sensor adaptable to many applications, e.g., vertical, horizontal, snap traps, live traps, bait stations, etc. In addition, sensors of the present disclosure can mitigate contamination that might generate false positives from dust, debris, partial immersion in water, etc. Further, sensors of the present disclosure may make long-term remote monitor feasible with simple battery power because there is no drawing of power before the sensor is activated by a capture event.

Advantages of Hall-effect sensors in accordance with some embodiments of the present disclosure may include their simple, reliable, and inexpensive operations and designs, and their electronic chips that are commonly used in widely available gadgets and products. They are often used as proximity sensors. In addition, they are small sensors that may be disposed into small enclosures in small size traps. These enclosures may then be filled-in with any suitable water-proofing materials, e.g., epoxy. For snap traps, Hall-effect sensors can detect when a snap trap is open or closed. Further, there is at a low or no risk to generate a false positive by simply moving the trap without snapping it. Hall-effect sensors can be retrofitted on any snap trap, e.g., wooden Victor, T-Rex, etc. Hall-effect sensors may also work even if traps are tightly attached to solid surfaces.

According to the present invention, the following claims are provided:

1. An animal trap sensor comprising
    a base comprising a distal end and a proximal end,
    a switch comprising a first metallic element and a second metallic element, and
    a signal unit,
        wherein the first metallic element and the second metallic element are electrically separated at the distal end of the base and electrically connected with the signal unit at the proximal end of the base, thereby forming an open circuit,
        wherein, when the first metallic element contacting the second metallic element, thereby forming a closed circuit, such that the signal unit transmits a signal to an off-site receiver.
2. The animal trap sensor of claim 1, wherein the first metallic element comprises a hollow region along a longitudinal axis of the first metallic element, wherein the hollow region is configured to sleeve the second metallic element such that an inside surface of the first metallic element surrounds an outside surface of the second metallic element.
3. The animal trap sensor of claim 2, wherein the first metallic element contacting the second metallic element by directly or indirectly triggering the switch such that the inside surface of the first metallic element contacting the outside surface of the second metallic element.
4. The animal trap sensor of any one of claims 1-3, wherein the first metallic element is a spring.
5. The animal trap sensor of claim 1, wherein the first metallic element and the second metallic element each comprise an outside surface and an inside surface such that the inside surface of the first metallic element and the inside surface of the second metallic element are opposite to each other.
6. The animal trap sensor of claim 5, wherein the first metallic element contacts the second metallic element by pressing the outside surface of the first and/or the outside surface of the second metallic element such that the inside surface of the first metallic element contacts the inside surface of the second metallic element, thereby forming the closed circuit.
7. The animal trap sensor of any one of claims 5-6, further comprising an electrical insulator disposed between the inside surfaces of the first and the second metallic elements such that the first metallic element forms a seesaw-like structure on the inside surface of the second metallic element using the electrical insulator as a pivot.
8. The animal trap sensor of claim 7, wherein the first metallic element contacts the second metallic element by a seesaw movement of the first metallic element such that the inside surface of the first metallic element contacts the inside surface of the second metallic element, thereby forming the closed circuit.
9. The animal trap sensor of any one of claims 1-8, wherein the switch is enclosed in a housing.
10. The animal trap sensor of claim 9, wherein the housing is a sleeve.
11. The animal trap sensor of claim 10, wherein the sleeve is configured to expand inside an animal trap such that a movement of the sleeve causes the first metallic element to contact the second metallic element, thereby forming the closed circuit.
12. The animal trap sensor of any one of claims 10 and 11, wherein the sleeve is made of a fabric.
13. The animal trap sensor of any one of claims 1-12, wherein the signal is transmitted wirelessly.
14. An animal trap system comprises
    an animal trap and
    the animal trap sensor of any one of claims 1-13.
15. The animal trap system of claim 14, wherein the first metallic element contacting the second metallic element by an animal directly or indirectly triggering the switch.
16. The animal trap system of claim 15, wherein the animal trap is a tilt-ramp trap.
17. The animal trap system of claim 14, wherein the first metallic element contacting the second metallic element by tripping the trap such that a movable part of the trap directly or indirectly triggering the switch causing the first metallic element to contact the second metallic element.
18. The animal trap system of claim 17, wherein the movable part is a handle or a jaw of the trap.
19. The animal trap system of claim 18, wherein moving the handle or snapping the jaw directly or indirectly triggers the switch causing the first metallic element to contact the second metallic element.
20. The animal trap system of any one of claims 17-19, wherein the animal trap is a snap trap.
21. The animal trap system of claim 17, wherein the movable part is a trap door such that vibration of closing the trap door directly or indirectly triggers the switch causing the first metallic element to contact the second metallic element.
22. The animal trap system of claim 21, wherein the animal trap is a wildlife trap.
23. The animal trap system of any one of claims 14-22, wherein the trap is a metal trap.
24. The animal trap system of claim 23, wherein the first metallic element is a part of the metal trap such that the part contacts the second metallic element, thereby forming the closed circuit.
25. The animal trap system of claim 24, wherein the part is a stirrup of the trap.
26. The animal trap system of any one of claims 23-25, wherein the second metallic element is a spring.
27. The animal trap system of any one of claims 14-26, wherein the off-site receiver receives the signal to register a capture event.
28. A bait station comprises the animal trap sensor of any one of claims 1-13,
    wherein the first metallic element contacting the second metallic element by an animal directly or indirectly triggering the switch.
29. The bait station of claim 28, wherein the off-site receiver receives the signal to register a hit.
30. A method of trapping an animal comprises
    providing an animal trap,
    disposing the animal trap sensor of any one of claims 1-13 unto the animal trap,
    contacting the first metallic element with the second metallic element, when the animal trap is tripped, thereby forming the closed circuit, and
    sending the signal to the off-site receiver to register a capture event.
31. The method of claim 30, wherein the animal trap is a tilt-ramp trap, a snap trap, or a wildlife trap.
32. Use of the animal trap sensor of any one of claims 1-13 for registering a capture event of an animal in a trap.

33. The animal trap sensor of any one of claims 1-13, further comprises a test mode control mechanism for initiating a test mode,
  wherein, when the test mode is initiated, if the off-site receiver receives the signal to register a capture event, this indicates that the animal sensor is operational; and if the off-site receiver does not receive the signal, this indicates that the animal sensor is not operational.

34. The animal trap sensor of claim 33, wherein the capture event registered in the test mode is not counted as a capture event in a trend analysis for predicting future capture event.

35. The animal trap sensor of any one of claims 33-34, wherein the test mode control mechanism comprises a test mode button for initiating the test mode.

36. The animal trap sensor of any one of claims 1-13 and 33-35, further comprising an accelerometer that measures acceleration in one or more axes of the sensor such that, when the acceleration exceeds a pre-set acceleration threshold value, the sensor is adapted to provide a move signal to the off-site receiver, wherein the move signal indicates the sensor has been moved and is not operational.

37. The animal trap sensor of claim 36, wherein, when the off-site receiver receives the move signal and the signal within 10 seconds between each other, the signal is registered as a false positive.

38. The animal trap sensor of any one of claims 36 and 37, wherein the accelerometer is a two- or three-axis accelerometer.

39. The animal trap system of any one of claims 14-27, further comprises a test mode control mechanism for initiating a test mode,
  wherein, when the test mode is initiated, if the off-site receiver receives the signal to register a capture event, this indicates that the animal sensor is operational; and if the off-site receiver does not receive the signal, this indicates that the animal sensor is not operational.

40. The animal trap system of claim 39, wherein the capture event registered in the test mode is not counted as a capture event in a trend analysis for predicting future capture event.

41. The animal trap system of any one of claims 39 and 40, wherein the test mode control mechanism comprises a test mode button for initiating the test mode.

42. The animal trap system of any one of claims 14-27 and 39-41, further comprising an accelerometer that measures acceleration in one or more axes of the sensor such that, when the acceleration exceeds a pre-set acceleration threshold value, the sensor is adapted to provide a move signal to the off-site receiver, wherein the move signal indicates the sensor has been moved and is not operational.

43. The animal trap system of claim 42, wherein, when the off-site receiver receives the move signal and the signal within 10 seconds between each other, the signal is registered as a false positive.

44. The animal trap system of any one of claims 42 and 43, wherein the accelerometer is a two- or three-axis accelerometer.

45. The animal trap system of any one of claims 14-27 and 39-44, wherein the trap comprises a divider disposed inside the trap between a main chamber of the trap and a trap entrance, wherein the divider comprises an opening leading to the main chamber, wherein the switch is disposed inside the trap between the opening and the trap entrance, such that an animal entering the main chamber through the opening will cause the first metallic element to contact the second metallic element.

46. The animal trap system of claim 45, wherein the height of the opening is from 15 mm to 25 mm and the width is from 15 mm to 30 mm.

47. The animal trap system of claim 45, wherein the height of the opening is from 18 mm to 22.5 mm and the width is from 17 mm to 25.5 mm.

48. The animal trap system of any one of claims 45-47, wherein the divider is an integral part of the trap.

49. The animal trap system of any one of claims 45-47, wherein the divider is a removable part of the trap.

50. The animal trap system of claim 49, wherein the divider is disposed inside the trap using a fastener.

51. The animal trap system of claim 50, wherein the fastener is a magnet.

52. The bait station of any one of claims 28 and 29, further comprises a test mode control mechanism for initiating a test mode,
  wherein, when the test mode is initiated, if the off-site receiver receives the signal to register a capture event, this indicates that the animal sensor is operational; and if the off-site receiver does not receive the signal, this indicates that the animal sensor is not operational.

53. The bait station of claim 52, wherein the capture event registered in the test mode is not counted as a capture event in a trend analysis for predicting future capture event.

54. The bait station of any one of claims 52 and 53, wherein the test mode control mechanism comprises a test mode button for initiating the test mode.

55. The bait station of any one of claims 28, 29, and 52-54, further comprising an accelerometer that measures acceleration in one or more axes of the sensor such that, when the acceleration exceeds a pre-set acceleration threshold value, the sensor is adapted to provide a move signal to the off-site receiver, wherein the move signal indicates the sensor has been moved and is not operational.

56. The bait station of claim 55, wherein, when the off-site receiver receives the move signal and the signal within 10 seconds between each other, the signal is registered as a false positive.

57. The bait station of any one of claims 55 and 56, wherein the accelerometer is a two- or three-axis accelerometer.

58. A method of trapping an animal comprises
  providing an animal trap,
  disposing the animal trap sensor of any one of claims 33-38 unto the animal trap,
  optionally initiating a test mode and sending a signal to the off-site receiver,
  optionally moving the sensor and sending a move signal to the off-site receiver,
  contacting the first metallic element with the second metallic element, when the animal trap is tripped, thereby forming the closed circuit, and
  sending the signal to the off-site receiver to register a capture event,
    wherein, when the test mode is initiated, if the off-site receiver receives the signal to register a capture event, this indicates that the animal sensor is operational; and if the off-site receiver does not receive the signal, this indicates that the animal sensor is not operational,
    wherein the move signal indicates the sensor has been moved and is not operational.

59. The method of claim 58, wherein the capture event registered in the test mode is not counted as a capture event in a trend analysis for predicting future capture event.

60. The method of claim 58 or 59, wherein the initiating a test mode is at setting up the trap or at performing a maintenance of the trap.

61. The method of claim 58, wherein, when the off-site receiver receives the move signal and the signal within 10 seconds between each other, the signal is registered as a false positive.

62. The method of any one of claims 58-61, wherein the animal trap is a tilt-ramp trap, a snap trap, or a wildlife trap.

63. Use of the animal trap sensor of any one of claims 33-38 for registering a capture event of an animal in a trap.

64. A method of monitoring an animal trap system using the sensor of any one of claims 33-38, comprising
    testing the sensor, comprising
        initialing the test mode,
        contacting the first metallic element with the second metallic element,
            wherein, if the off-site receiver receives the signal to register a capture event, this indicates that the animal sensor is operational; and if the off-site receiver does not receive the signal, this indicates that the animal sensor is not operational,
    exiting the test mode, and
    monitoring a capture event.

65. The method of claim 64, further comprising
    moving the sensor, comprising
        sending a move signal indicating the sensor has been moved and is not operational,
        optionally, contacting the first metallic element with the second metallic element,
            wherein, if the off-site receiver receives the move signal and the signal to register a capture event within 10 seconds between each other, the signal is registered as a false positive.

66. The method of claim 64 or 65, wherein the capture event registered in the test mode is not counted as a capture event in a trend analysis for predicting future capture events.

67. The method of any one of claims 64-66, wherein the initiating a test mode is at setting up the trap or at performing a maintenance of the trap.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:
1. An animal trap sensor comprising:
    a signal unit; and
    a sensor comprising:
        a base comprising a distal end and a proximal end,
        a switch comprising a first metallic element and a second metallic element, wherein the first metallic element and the second metallic element are electrically separated at the distal end of the base and electrically connected with the signal unit at the proximal end of the base, thereby forming an open circuit, wherein the switch is adapted to be electrically connected with the signal unit via an electrical conductor of the switch inserted into an electrical receptacle of the signal unit, wherein the first metallic element compromises a hollow region along a longitudinal axis of the first metallic element, wherein the hollow region of the first metallic element is configured to sleeve the second metallic element such that an inside surface of the first metallic element surrounds an outside surface of the second metallic element and such that the inside surface of the first metallic element and the outside surface of the second metallic element are opposite to each other, wherein the first metallic element contacts the second metallic element by pressing an outside surface of the first metallic element such that the inside surface of the first metallic element contacts the outside surface of the second metallic element, thereby forming a closed circuit, such that the signal unit is configured to transmit a capture signal to an off-site receiver, and
    wherein the signal unit further comprises an accelerometer that measures acceleration in one or more axes of the sensor such that, when a measured acceleration exceeds a pre-set acceleration threshold value, the sensor is adapted to provide a move signal to the off-site receiver, wherein the move signal indicates the sensor has been moved and is not operational, and, wherein, when the off-site receiver receives the move signal and the capture signal within 10 seconds between each other, the capture signal is registered as a false positive.

2. The animal trap sensor of claim 1, further comprises a test mode control mechanism for initiating a test mode,
    wherein, when the test mode is initiated, if the off-site receiver receives the capture signal to register a capture event, this indicates that the sensor is operational; and if the offsite receiver does not receive the capture signal, this indicates that the sensor is not operational.

3. The animal trap sensor of claim 2, wherein the capture event registered in the test mode is not counted as a capture event in a trend analysis for predicting future capture events.

4. The animal trap sensor of claim 2, wherein the test mode control mechanism comprises a test mode button for initiating the test mode.

5. The animal trap sensor of claim 1, wherein, when the off-site receiver receives the move signal and the capture signal within 1 second between each other, the capture signal is a false positive signal.

6. The animal trap sensor of claim 1, wherein, when the off-site receiver receives the move signal and the capture signal within 2 seconds between each other, the capture signal is a false positive signal.

7. The animal trap sensor of claim 1, wherein, when the off-site receiver receives the move signal and the capture signal within 5 seconds between each other, the capture signal is a false positive signal.

* * * * *